United States Patent [19]

Chandler et al.

[11] Patent Number: 5,280,377
[45] Date of Patent: Jan. 18, 1994

[54] BEAM SCANNING GALVANOMETER WITH SPRING SUPPORTED MIRROR

[75] Inventors: Jasper S. Chandler; David M. Orlicki, both of Rochester; John M. Kresock, Elba, all of N.Y.

[73] Assignee: Eastman Kodak Company, Rochester, N.Y.

[21] Appl. No.: 723,290

[22] Filed: Jun. 28, 1991

[51] Int. Cl.$^5$ .................................. G02B 26/08
[52] U.S. Cl. .................... 359/196; 359/213; 359/224; 346/109; 185/37
[58] Field of Search ........... 346/109; 359/196–199, 223–224; 185/45, 37

[56] References Cited

U.S. PATENT DOCUMENTS

| | | | |
|---|---|---|---|
| 3,932,809 | 1/1976 | Frank | 324/96 |
| 4,057,331 | 11/1977 | Ong et al. | 350/285 |
| 4,123,146 | 10/1978 | Dragt | 350/285 |
| 4,251,798 | 2/1981 | Swartz et al. | 359/216 |
| 4,732,440 | 3/1988 | Gadhok | 350/6.6 |
| 4,802,720 | 2/1989 | Paulsen | 350/6.6 |
| 4,861,125 | 8/1989 | Vaught | 350/6.6 |
| 4,902,083 | 2/1990 | Wells | 350/6.6 |

Primary Examiner—Bruce Y. Arnold
Assistant Examiner—James Phan
Attorney, Agent, or Firm—Robert L. Randall

[57] ABSTRACT

A beam scanning galvanometer is disclosed which oscillates a mirror in a non-resonant mode. The moving parts of the galvanometer are made with as small a moment of inertia as possible because the mirror is oscillated in a non-resonant mode. The galvanometer uses two sets of crossed leaf-springs to support the mirror instead of bearings which are usually used in non-resonant galvanometers. Each of the sets of leaf-springs is formed of a single strip of cold rolled stainless steel. The springs are embedded in uniquely shaped cavities in a permanent magnet that supports the mirror at a distance very close to an axis of rotation of the mirror. The mirror is specially shaped with beveled edges so that its moment of inertia is low and so that it can oscillate in very close proximity to a driving current coil which surrounds the mirror supporting magnet. A magnetic position sensor is used to detect an angular position of the mirror during operation of the galvanometer. A compensating system eliminates distorting magnetic field effects from a magnetic driving system from adversely influencing the magnetic position sensor. Signals from the magnetic position sensor are usable to provide accurate feedback information to a galvanometer driving system.

17 Claims, 12 Drawing Sheets

BEAM SCANNING GALVANOMETER WITH SPRING SUPPORTED MIRROR

CROSS REFERENCE TO RELATED PATENT APPLICATIONS

The present invention is related to four co-pending U.S. Pat. applications. The first related U.S. application, Ser. No. 457,593 (S. Sarraf, filed Dec. 27, 1990) is entitled "Thermal Printer" and has a common assignee with the present patent application. The second related U.S. application, Ser. No. 722,753, which is being filed concurrently with the present patent application, is entitled "Improved Method and Circuit for Driving an Electro-Mechanical Device Rapidly with Great Precision", has a common assignee with the present patent application, and has as its inventors, J. Kresock, J. S. Chandler, D. Orlicki and T. Neale. The third related U.S. application, Ser. No. 723,368, which is being filed concurrently with the present patent application, is entitled "Beam Scanning Galvanometer with Low Inertia Mirror and Magnet", has a common assignee with the present patent application, and has as its inventors, J. S. Chandler, D. Orlicki and J. Kresock: The fourth related U.S. application, Ser. No. 728,910, which is being filed concurrently with the present patent application, is entitled "Magnetic Position Sensor", has a common assignee with the present patent application, and has as its inventors, D. Orlicki, B Koppe and J. Kresock.

FIELD OF THE INVENTION

The invention relates to beam scanning galvanometers and more particularly to galvanometers which are operated in a non-resonant mode.

BACKGROUND OF THE INVENTION

Beam scanning galvanometers are used in many applications that require controlled high speed cyclical deflection of a beam of light across a defined field of observation to either produce or to read an image. Generally these galvanometers are designed to operate in either a resonant mode or a non-resonant mode.

Galvanometers that are designed to operate in a resonant mode are typically used in applications in which it is desired to use relatively low levels of power to drive the galvanometer. In these applications, an oscillating mirror of the galvanometer is supported with a flexure or spring. The stiffness of the spring and the mass and shape of the mirror produce a natural frequency for the galvanometer. When the mirror is oscillated at the natural frequency (i.e., resonant operation) very little power is needed to drive the mirror. When a galvanometer operates in a resonant mode, the mirror deflects symmetrically about a neutral position. In other words, the mirror deflects in a first direction to a first limit, returns to the neutral position and then deflects in a second direction to a second limit. Each of the limits are equidistant from the neutral position and the mirror consumes equal time in reaching either of the two limits.

In the resonant mode of operation, the angular displacement of the mirror follows a sinusiodal pattern as a function of time. A light beam that is reflected onto a flat surface by such a mirror follows a non-linear deflection pattern as a function of time. Thus, galvanometers that operate in a resonant mode are typically used only in applications which do not require linearity in the speed of a beam of light on a scanned surface. Additionally, these galvanometers are typically used when it is desired to perform a scanning operation during deflections of the mirror in either direction. This bidirectional scanning produces certain image distortions known as a "pincushion effect". Consequently, these resonant galvanometers are used only in applications which produce or read images on a low resolution basis, e.g., in the order of 200 dots per inch or less. In low resolution applications, the inherent non-linearity and distortions which arise from resonant scanning are acceptable.

Many systems that employ beam scanning galvanometers are not tolerant of the non-linearity of a resonant mode of operation of the galvanometer.

In some light scanning applications, such as laser printing, there is a need to transfer a relatively high concentration of energy with a scanning mirror. For example, in the thermal printer disclosed in previously cited U.S. Pat. application Ser. No. 457,593, a laser is employed to cause a transfer of dye from a donor dye film to a receiver. Presently, the power which a laser can introduce to this thermal printing system is limited to about 50 milliwatts. In order to produce a thermal printer which operates at the fastest possible rate within this power limitation of the laser, it is desirable to avoid scanning the laser beam across the dye donor film with a sinusoidal velocity. If a resonating beam scanning galvanometer (which produces a scanned beam with a sinusoidal velocity) were to be employed in this thermal printer, the speed of operation of the thermal printer would need to be reduced. This is because a beam traversing with a sinusoidal velocity has a peak velocity that is substantially higher than the average velocity. In a thermal printer, the scanning rate of the galvanometer (i.e., the number of scans per second) must be kept low enough so that the laser can produce the desired dye transfer at the maximum velocity of the scanned beam. In other words, if the 50 milliwatt laser will produce the desired dye transfer at a maximum beam velocity of 20 inches per second, then the rate of oscillation of the mirror must be kept low enough so that the maximum velocity of the beam is 20 inches per second. In a sinusoidal velocity profile, a maximum beam velocity of 20 inches per second corresponds to an oscillation rate that produces an average beam velocity of only about 12 inches per second. Thus a thermal printer using a sinusoidal beam velocity cannot achieve an optimum speed of operation for a particular power level of a laser used as part of the printer.

An optimization of speed of operation of the thermal printer for a particular power level of a laser is achieved when the beam is scanned across a workpiece at a constant velocity. In this mode of operation, the maximum velocity of the beam is equal to the average velocity of the beam. Thus the laser can be employed to deliver its maximum power during the entire scan cycle.

Galvanometers which are capable of scanning a beam of light across a flat surface at a constant velocity are known in the prior art. See, for example, U.S. Pat. No. 4,791,591 (K. Asanuma et. al.), issued Dec. 13, 1988. Galvanometers of this type (i.e., non-resonant) are operated in conjunction with a driving current control circuit. Typically these current control circuits function on a feedback principle.

The deflecting mirror of some galvanometers is equipped with an angular position sensing mechanism that is responsive to the actual deflection of the mirror. Driving current is continuously varied in response to the position sensing mechanism to assure that the mirror does indeed follow a desired deflection pattern as a function of time.

Typically these angular position sensing mechanisms consist of elements that produce variations in capacitance as a function of angular displacement. In order to operate effectively, two elements must move relative to each other in a concentric manner. One element moves with the mirror and the other element remains stationary. The elements must be very close to one another, in the order of 0.001 inches or less. In order to achieve such a closely spaced concentric motion between the sensing elements, the mirror must be rotated about a rigidly fixed axis. Consequently, the use of a capacitor-based angular position sensing mechanism in a galvanometer places a limitation on the type of mirror deflection which can be used in the galvanometer. In prior art non-resonant galvanometers, an axis of rotation of the mirror is supported in bearings (ball-bearings, needle bearings, sleeve bearings and etc.) in order to assure that the position sensors function properly.

Bearings that support a mirror in a galvanometer are subject to wear, particularly in the context of high speed operation that may require thousands of oscillations per minute. Bearings are also undesirable in a galvanometer because they permit a certain amount of deflection of the mirror in planes that are not parallel to the surface being scanned (i.e., cross-axis deflection). This cross-axis deflection can be controlled to a tolerable level with high quality bearings for applications that require moderately high resolution, i.e., 600 dots per inch or less. However, cross-axis deflection must be more carefully controlled in high resolution applications, i.e., 2000 dots per inch or higher.

Galvanometers which use bearing supported mirrors to produce high resolution images are relatively expensive. Such galvanometers typically cost between $500.00 and $1,000.00 per unit. Galvanometer costs this high are prohibitive when it desired to use galvanometers in thermal printers that are intended for desk-top applications. This is one reason that relatively low cost desk-top, high resolution thermal printers have heretofore not been produced with galvanometer-based printing systems.

An additional problem arises when galvanometers are used in a non-resonant mode in a unit such as a thermal printer. The galvanometers must be driven with forces substantially greater than those used to drive a galvanometer of an equivalent size in a resonant mode. These larger forces present two problems. First, the application of large forces requires the expenditure of large amounts of power, and second, the large driving forces produce equivalently large reaction forces that cause undesirable vibrations which interfere with the production of high resolution images. Each of these two conditions can be accommodated in a thermal printer, but typically at an undesirably high cost.

A thermal printer that provides a large amount of power to its galvanometer is typically too expensive for desk top applications. Thermal printers which consume large amounts of power are also less likely to be adaptable to applications where portability is a consideration.

Large reaction forces, that arise from a nonresonant mode of operation, can be prevented from producing undesirable vibrations by mounting the galvanometer on a rigid and massive support. However, introduction of massive support structures into a thermal printer precludes the use of the thermal printer in applications in which portability is an important consideration.

Heretofore, efforts were made to control the forces required to operate beam scanning galvanometers in a non-resonant mode. These efforts have focused on keeping the rotational axis of the mirror as close as possible to a reflecting surface of the mirror. When this distance is kept small, the moment of inertia of the oscillating mirror is kept correspondingly small and the forces needed to drive the mirror are thus kept relatively low. Prior art non-resonant galvanometers designs have heretofore employed bearings to support an axis of rotation of the mirror in order to maintain a low moment of inertia for the mirror.

It has been recognized that, from the point of view of reduced cross axis deflection, galvanometer mirrors supported on flexures or springs are superior to galvanometer mirrors supported on bearings. See for example, U.S. Pat. No. 4,732,440 (Gadhok), issued Mar. 22, 1988. However, the prior art does not teach how to apply the principles of a flexure-based mirror supporting system to a galvanometer that operates in a non-resonant mode.

An additional shortcoming of prior art nonresonant galvanometers is the technique used to achieve a scan-retrace mode of operation. When non-resonant galvanometers are used to perform printing operation, the scanning of a light beam is typically limited to one direction of travel of the mirror. In other words, a light beam is turned on while a mirror deflects in a first direction. While the mirror is being returned to a starting position, the light beam is turned off. This technique is known as a scan-flyback or scanretrace mode of operation. In order to avoid a waste of time during the flyback or retrace portion of a mirror deflection cycle, the mirror is typically returned to its starting position in a period of time which is much shorter than the scanning time.

Many prior art galvanometers are provided with springs that cause the mirror to rapidly return to its starting position after completion of a scan. These springs do not support the mirror. They are used only to drive the mirror to its starting position. Typically the mirror is driven to the return position at a very high speed. A mirror driven in such a high speed manner returns to its starting position with a shock that produces vibrations in the mirror and the spring. When a scan cycle begins immediately after the mirror reaches its return position, these vibrations adversely effect the stability of the beam scanning. In moderate resolution printing these vibrational anomalies are sufficiently small as to have only second order effects on the quality of an image. However, in printing operations requiring resolutions of 2000 dots per inch and higher, these vibrations are intolerable.

It is desirable therefore to provide a beam scanning galvanometer that is usable in high resolution printing operations which is free from undesirable bearing support systems and anomalous vibrations and which operates with relatively low peak power requirements.

SUMMARY OF THE INVENTION

The present invention is directed to a beam scanning galvanometer that oscillates a mirror in a non-resonant mode. The mirror is rotatably supported with a pair of crossed springs or flexures. There are no bearings in the galvanometer. The galvanometer is constructed so that its moving parts have as small a moment of inertia as possible. A mirror supporting magnet is specially shaped to permit positioning of the mirror close to its axis of oscillation. Additionally, special shaping of the magnet and springs provides for a galvanometer which can be assembled at a low cost and with high repeatability of performance.

Viewed from one aspect, the present invention is directed to a beam scanning galvanometer adapted to operate in a non-resonant mode with an oscillating mirror member thereof supported by springs.

Viewed from another aspect, the present invention is directed to a beam scanning galvanometer having a mirror member supported with at least one spring. The spring comprises a metallic strip having a substantially uniform thickness. The metallic strip has first and second sides substantially parallel to each other. The first side has a first notch formed therein which extends more than one half of the distance between the first and second sides. The second side has a second notch formed therein which extends more than one half of the distance between the first and second sides. The strip is formed into a configuration in which the first and second notches overlie each other.

Viewed from still another aspect, the present invention is directed to a beam scanning galvanometer. The galvanometer comprises a mirror attached to a magnet. The magnet is rotatably supported on springs. The magnet is surrounded with a driving coil having a center of force. The mirror has an axis of oscillation that is substantially aligned with the center of force of the coil.

Viewed from yet another aspect, the present invention is directed to a beam scanning galvanometer. The galvanometer comprises a mirror attached to a magnet. The magnet is adapted to oscillate about an axis that is aligned substantially with a central axis of the magnet. The magnet is moveably attached to a fixed support with springs. The magnet has cavities formed therein. The axis of oscillation of the magnet passes through the cavities. The springs which attach the magnet to the fixed support are positioned substantially within the cavities.

Viewed from still another aspect, the present invention is directed to a beam scanning galvanometer. The galvanometer comprises an oscillating mirror member which is adapted to oscillate about an axis that is aligned substantially with a central axis of the member. The mirror member is moveably attached to a fixed portion of the galvanometer with springs. The mirror member has cavities formed therein through which the axis of oscillation of the mirror member passes. The springs are positioned within the cavities.

The invention will be better understood from the following detailed description taken in consideration with the accompanying drawings and claims.

The drawings are not necessarily to scale.

DETAILED DESCRIPTION

Figure 1:
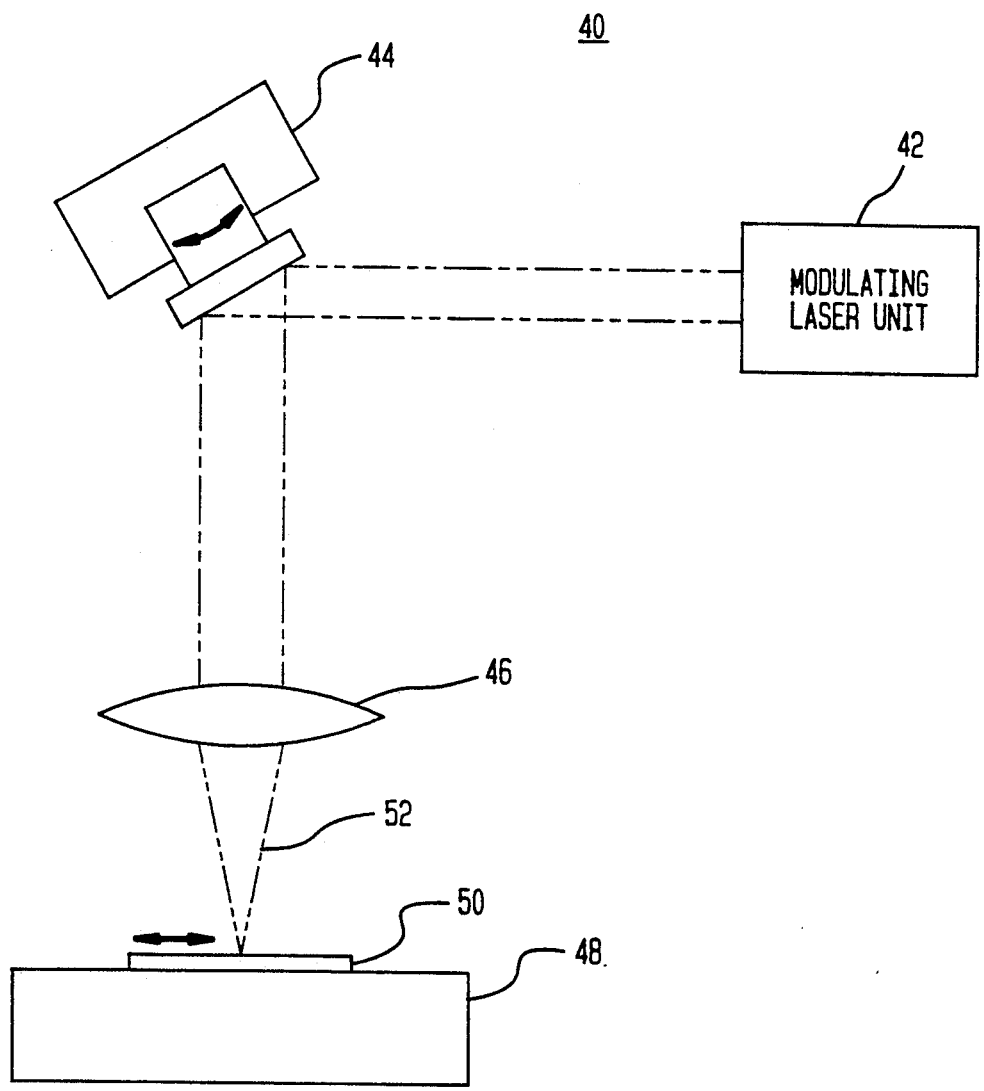
FIG. 1 shows a partial schematic view of a thermal printer in which the present invention finds utility.

Referring now to FIG. 1, there is shown a schematic view of a thermal printer 40 in which the present invention has utility. The thermal printer 40 comprises a modulating laser unit 42, a beam scanning galvanometer 44, a scanning lens 46, and support 48 that supports a workpiece 50 onto which an image is to be formed. An image is formed when a focused and modulated beam 52 of laser-produced light is scanned across the workpiece 50 by the beam scanning galvanometer 44. An example of a thermal printer in which the present invention is useful is disclosed and claimed in U.S. Pat. application Ser. No. 457,593, which is described in the Related Patent Applications section hereinabove.

The thermal printer 40 is used to produce computer generated images as transparencies or slides in a 35 mm. format, i.e., approximately 1 inch by 1.5 inch. The slides are used to generate light projected images on a screen which are hundreds of times larger than the slide. Consequently the image formed on the slide must be at an almost photographic quality, i e., a resolution of 4000 pixels or dots per inch.

In order to produce images on the workpiece 50 with the desired resolution of 4000 dots per inch, it is necessary to maintain very precise control of the speed of the scanned beam 52 across the workpiece 50. The control of speed of the beam 52 is achieved by controlling the operation of the beam scanning galvanometer 44.

Figure 2:
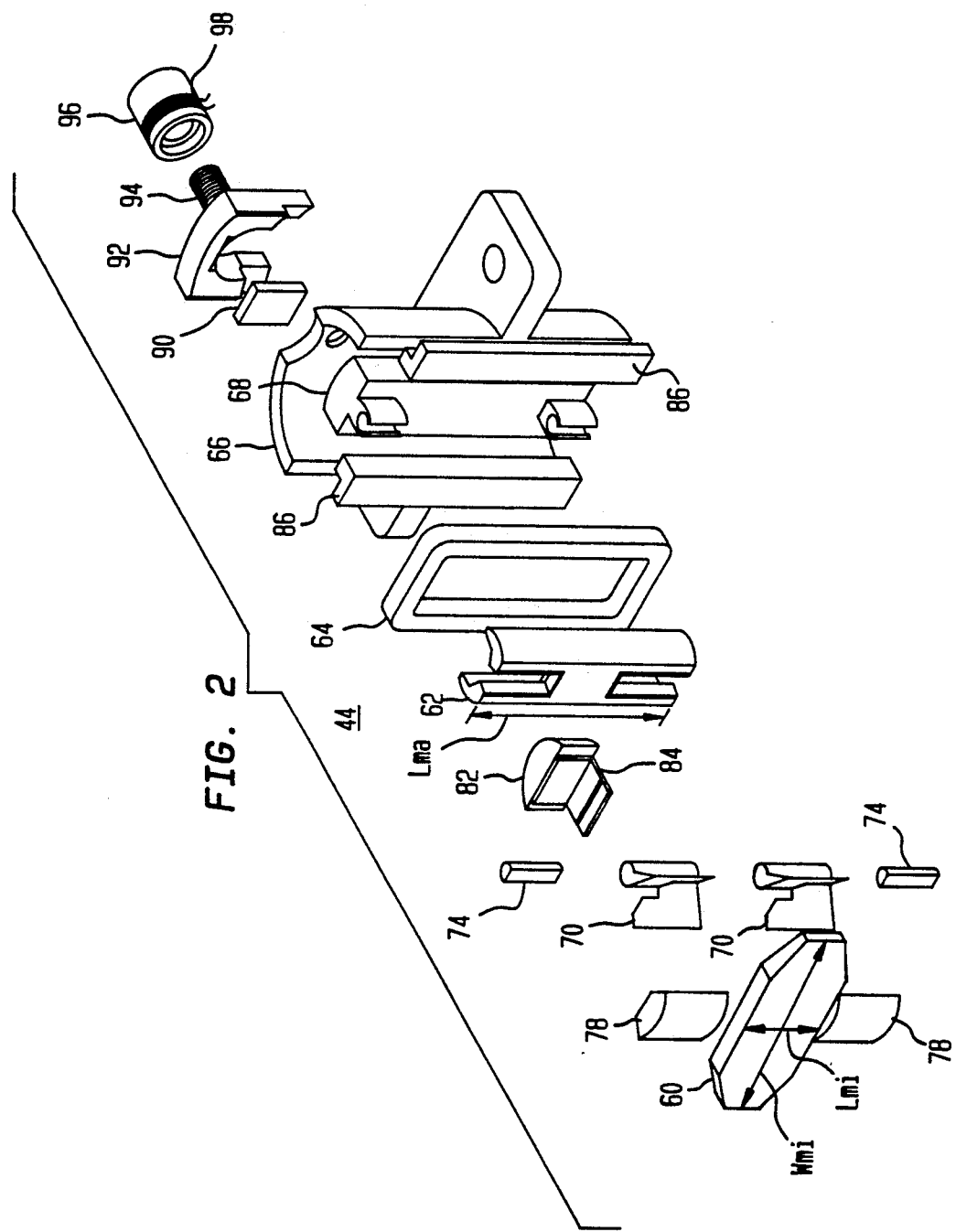
FIG. 2 shows an exploded perspective view of a beam scanning galvanometer in accordance with the present invention.

Referring now to FIG. 2, there is shown an exploded perspective view of a preferred embodiment of the beam scanning galvanometer 44 (hereinafter "galvanometer") in accordance with the present invention. The galvanometer 44 comprises a mirror 60, a driving magnet 62, a driving coil 64, a housing 66, a spring support 68, first and second essentially identical springs 70, first and second essentially identical center pins 74, magnet inserts 78, a sensor magnet 82, a sensor magnet support 84, coil support rails 86, a Hall effect sensor 90, a sensor support 92, a null slug 94, a null slug holder 96, and a compensating coil 98.

Figure 3:
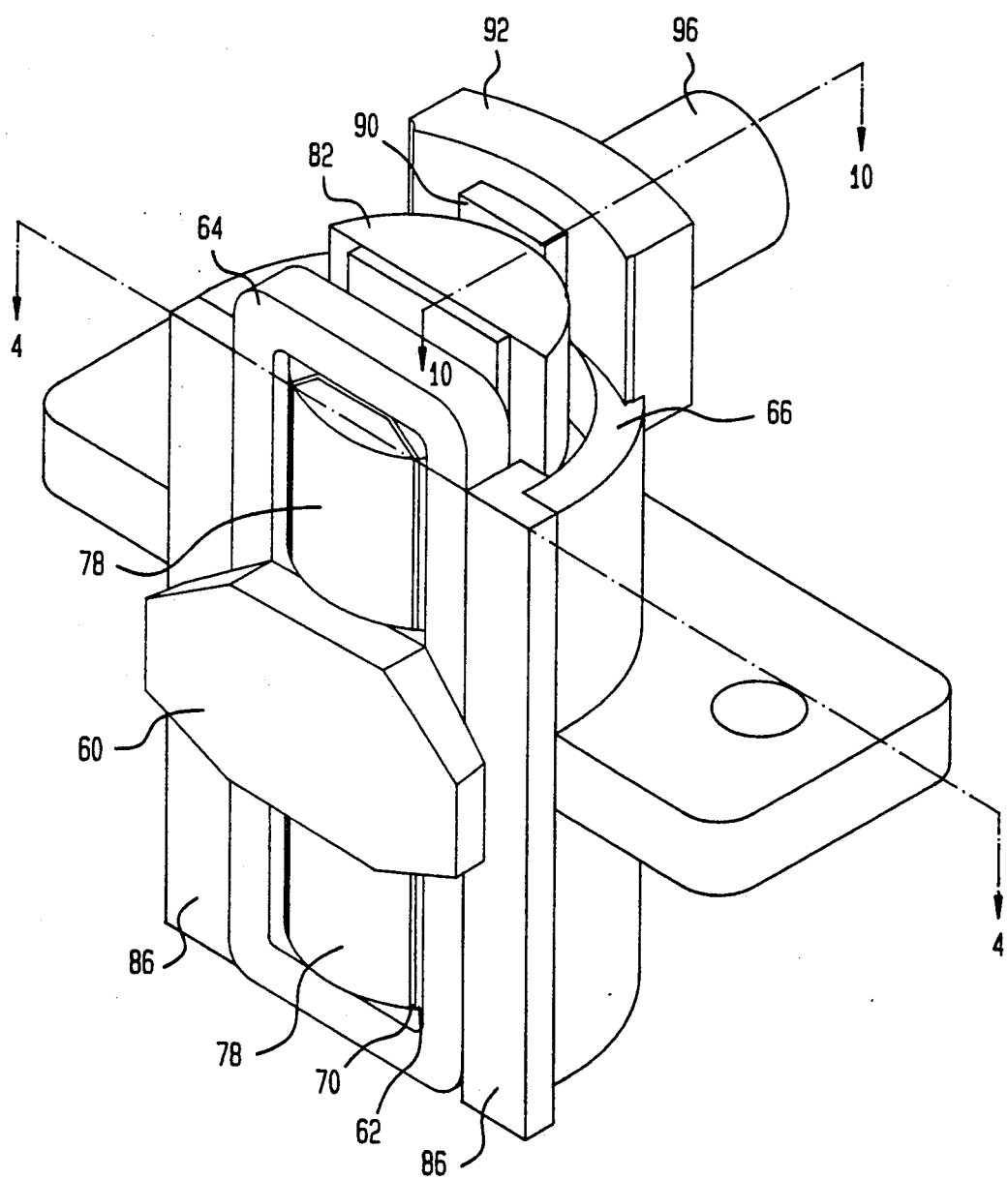
FIG. 3 shows a perspective view of the galvanometer of FIG. 2 in an assembled state.

Referring now to FIG. 3, there is shown the galvanometer 44 of FIG. 2 in an assembled state. It can be seen that the mirror 60 is coupled to the driving magnet 62. The driving magnet 62 is coupled to the springs 70 which are coupled to the spring support 68 (not visible in FIG. 3, but shown in FIGS. 2 and 4) and held in place with the center pins 74 (not shown in FIG. 3, but shown in FIGS. 2 and 4). The spring support 68 is coupled to the housing 66 with machine screws (not shown). The magnet inserts 78 are coupled to the springs 70, and to the driving magnet 62. The driving coil 64 is coupled to the coil support rails 86 which are coupled to the housing 66. The driving coil 64 surrounds the driving magnet 62 in the assembled galvanometer 44. In a preferred embodiment of the galvanometer 44, the mirror 60, the springs 70, the magnet inserts 78, the driving coil 64 and the coil support rails 86 are attached to their respective supports with epoxy adhesive.

The Hall effect sensor 90 and the null slug holder 96 are coupled to the sensor support 92. The sensor support 92 is coupled to the housing 66. The sensor magnet 82 is coupled to the sensor magnet support 84 which is coupled to the driving magnet 62. The null slug 94 (not shown in FIG. 3, but shown in FIGS. 2 and 10) is moveably coupled to the null slug holder 96. In a preferred embodiment of the galvanometer 44, the Hall effect sensor 90, the null slug holder 96, the sensor support 92 and the sensor magnet 82 are attached to their respective supports with epoxy adhesive. In a preferred embodiment, the Hall effect sensor 90 is a model UGN 3503 T/U Hall Effect Magnetic Sensor available from Sprague Corp.

In operation, the mirror 60 oscillates angularly when current passes through the driving coil 64. A field generated by the current in the driving coil 64 generates a rotational force on the driving magnet 62. As the driving magnet 62 rotates, the springs 70 produce a restorative force on the driving magnet 62. When the direction of current in the driving coil 64 is reversed, the driving magnet 62 is driven in an opposite rotational direction by the field generated in the driving coil 64 and the restorative force of the springs 70. The driving coil 64 is supplied with varying currents from a coil driving circuit (shown in FIGS. 13 and 14) that generates a non-resonant oscillating action in the driving magnet 62 and the attached mirror 60. The coil driving circuit is disclosed and claimed in a U.S. application entitled "Improved Method and Circuit for Driving an Electro-Mechanical Device Rapidly with Great Precision", filed concurrently herewith and identified in the Related Patent Applications section hereinabove and incorporated herein.

The combined mass and shape of the driving magnet 62 and the mirror 60 along with the stiffness of the springs 70 produces a structure which has a predictable natural frequency of oscillation. In a preferred embodiment of the galvanometer 44, this natural frequency is used advantageously, even though the galvanometer is not operated in a resonant mode. Details of this advantageous use are described hereinbelow.

The galvanometer 44 is constructed so that the mirror 60 and the driving magnet 62 are readily moveable with precise control. There are a plurality of design features which contribute to this desirable characteristic. First, the mirror 60 is shaped to have a minimum moment of inertia. Second, an axis of rotation of the mirror 60 is very close to a reflective surface of the mirror. Third, a combined moment of inertia of the driving magnet 62 and the mirror is relatively low in comparison to a driving force which the magnet 62 is capable of producing. Fourth, the mirror 60 experiences virtually no cross-axis deflection during its angular oscillations. Fifth, the retrace of the mirror 60 is performed at a speed that is in the same order of magnitude as the speed with which the mirror would traverse if traveling at a natural frequency of the combined mirror 60, driving magnet 62 and springs 70.

Referring back now to FIGS. 2 and 3, it can be seen that the mirror 60 appears to be large, relative to the overall size of the galvanometer 44. This is so because of the nature of the thermal printer 40 of FIG. 1. The scanning lens 46 produces a focused output spot which is inversely proportional to the size of an input beam. In order to attain a very small focused spot, in the order of 5 microns, the input beam from the laser unit 42 must be large, in the order of a half inch or larger. Additionally, the input beam from the laser unit 42 strikes the mirror 60 at an angle. This causes the input beam to take on an elliptical shape on a reflecting surface of the mirror 60. In order to fully reflect the entire input beam, the mirror must be wide enough to extend to the extreme limits of the ellipse formed by the beam on the reflecting surface. All of these characteristics of the thermal printer 40 create a situation in which a very wide mirror is required. Ironically, the maximum dimension of the mirror 60 is oriented orthogonally to an axis of rotation of the mirror 60. This produces a situation in which the deleterious effects of the moment of inertia of the mirror 60 are maximized. Consequently, it is important to produce the mirror 60 with as small a moment of inertia as is reasonably possible, consistent with the constraints dictated by the optical needs of the thermal printer 40.

Figure 4:
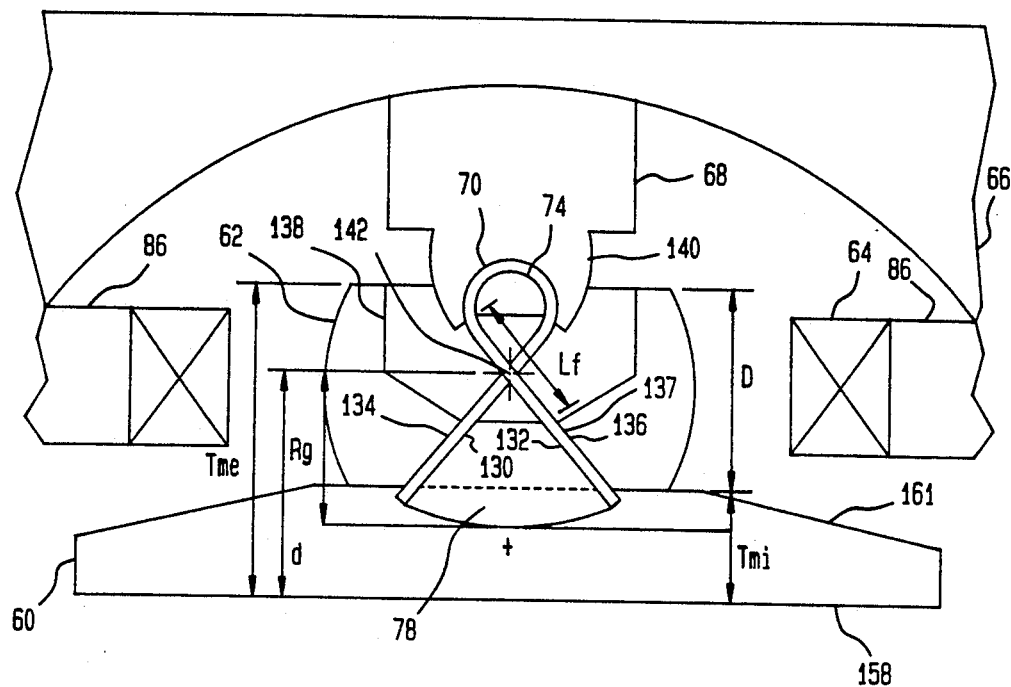
FIG. 4 shows a partial cross-sectional view of the galvanometer taken along the dashed lines 4—4 in a first operational position.

Referring now to FIG. 4, there is shown a partial cross-sectional view of the galvanometer 44 of FIG. 3 taken along the dashed lines 4—4 of FIG. 3. The spring 70 is shown engaged with the driving magnet 62 and the spring support 68 leaving an unengaged portion (free length) Lf of the spring 70. The spring 70 is held in place within the spring support 68 with the center pin 74. Each of the center pins 74 is assembled so that a flat portion thereof is positioned to allow the springs 70 to deflect without an undesired shortening of the free length Lf. First and second free ends 130 and 132 are attached to sides 134 and 136, respectively, of a cavity (notch) 137 formed in the driving magnet 62. This arrangement provides for the driving magnet 62 being supported by two sets of crossed leaf springs or flexures, with each of the springs 70 forming one of the sets.

The sides 134 and 136 of the notch 137 are formed so that their respective orientation to each other is a predetermined angle which, in a preferred embodiment of the present invention, is 90°. When the free ends 130 and 132 are positioned against the sides 134 and 136, the spring 70 becomes shaped so that a well defined crossover point develops between the free ends 130 and 132. This cross-over point is an axis of rotation 142 for the mirror 60.

A cavity 138 is formed in the driving magnet 62 which permits the driving magnet 62 to substantially surround a spring holding portion 140 of the spring support 68. This arrangement allows the axis of rotation 142 to be positioned within the driving magnet 62. Indeed, the axis of rotation 142 is substantially coincident with a center axis of mass of the driving magnet 62 and a center of force of the driving coil 64. In other words, the driving magnet 62 is supported in a manner that minimizes its moment of inertia as it rotates about the axis of rotation 142.

It can be seen that a reflecting surface 158 of the mirror 60 is displaced from the axis of rotation 142 at a distance d. The supporting arrangement for the mirror 60 allows this distance d to be minimized. The distance d is equal to the thickness Tmi of the mirror 60 and no more than about one half of the thickness D of the driving magnet 62. This has the desirable effect of minimizing a radius of gyration Rg of the combined mirror 60, the magnetic inserts 78 and driving magnet 62. This combination is referred to herein as a mirror member and is shown in FIG. 4 having an overall thickness Tme. The moment of inertia of the mirror member varies with the square of the radius of gyration Rg. Therefore, a minimizing of the radius of gyration Rg has a substantial effect on a reduction of the moment of inertia of the mirror member.

Figure 5:
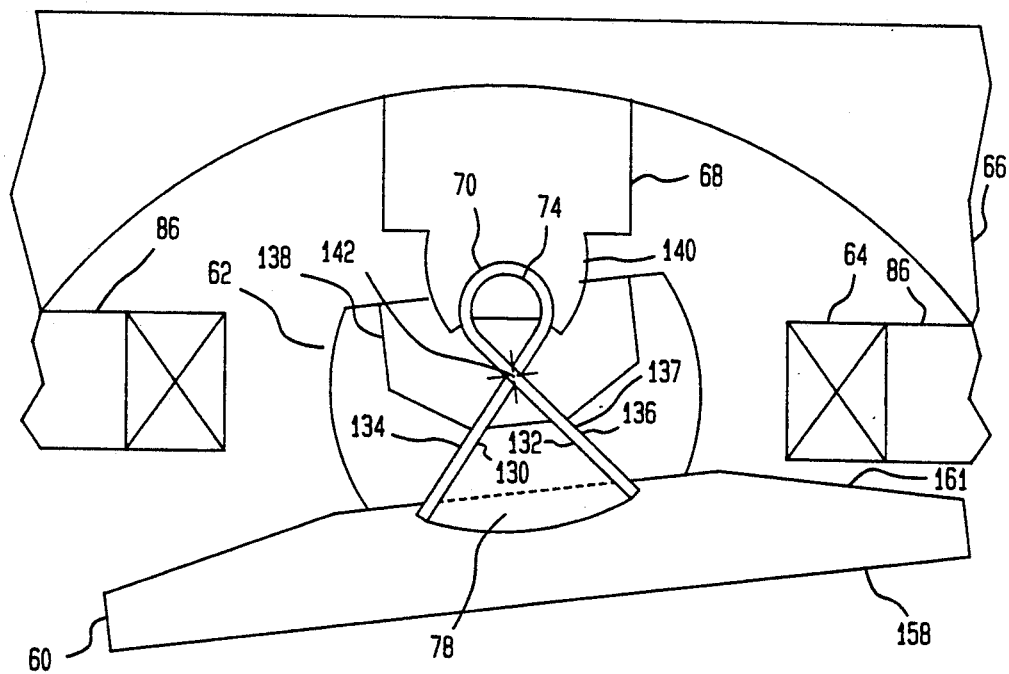
FIG. 5 shows a cross-sectional view of the same galvanometer of FIG. 4 in a second operational position.

Referring now to FIG. 5, there is shown a view of the galvanometer of FIG. 4 with the mirror 60 moved to another operating position to illustrate certain features of the mirror 60 which reduce the moment of inertia of the mirror 60 and the mirror member. A back side 161 of the mirror 60 is relieved (beveled) to allow additional deflection without interference with the driving coil 64. This relief (beveling) provides a beneficial reduction in the moment of inertia of the mirror member. The mirror 60 can move through a substantial deflection while the radius of gyration Rg of the mirror is maintained desirably small. In a preferred embodiment of the galvanometer 44, the deflection of the mirror 60 is 7.8° to either side of a neutral position shown in FIG. 4. A small radius of gyration Rg results in a relatively low moment of inertia for the mirror member. Furthermore, the beveling of the back surface 161 of the mirror 60 results in a reduction of its mass at its outer extremities. This reduction of mass also contributes to a reduction in the moment of inertia of the mirror member.

Referring back now to FIG. 3, there is shown an additional feature of the mirror 60 that contributes to a reduction of the moment of inertia of the mirror member. The reflecting surface 158 of the mirror 60 is shaped to simulate an ellipse. The beam produced by the laser unit 42 of FIG. 1 is circular, but when the beam impinges on the mirror 60, its reflection becomes elliptical. This is because the mirror 60 is oriented at an acute angle with respect to an axis of the beam. In order to assure a transfer of all of the energy from the beam, the mirror 60 has a minimum width Wmi (i.e., a dimension orthogonal to its axis of rotation) and a minimum length Lmi (i.e., a dimension along its axis of rotation) that is indicated by the size of a laser beam produced by the laser unit 42 of FIG. 1 and the angle of incidence of the beam on the mirror 60. In the mirror 60 used in the thermal printer 40 of FIG. 1, the width Wmi is much greater than the length Lmi. Trimming away corners of the reflecting surface substantially reduces the mass and the moment of inertia of the mirror 60.

Referring back now to FIG. 2, there is shown an additional feature of the galvanometer 44 that contributes to its desirable performance. The driving magnet 62 has a relatively long and narrow configuration with an overall shape that is substantially cylindrical. This configuration of the driving magnet 62 contributes to the overall efficiency of the design of the galvanometer 44 by providing a high torque to inertia ratio.

The torque which is developed on the driving magnet 62 by the current in the driving coil 62 is proportional to the length of the driving magnet 62. The moment of inertia of a rotatable structure increases linearly as a function of the structure's dimension in the direction of its axis of rotation. The moment of inertia of such a structure increases with the cube of the dimension of the structure orthogonal to its axis of rotation.

In the operation of the thermal printer 40 of FIG. 1, there is a desire to produce a high torque on the mirror member (i.e., the mirror 60, the driving magnet 62 and the magnet inserts 78) while maintaining a low moment of inertia of the mirror member (i.e., a high torque of inertia ratio). With minimum dimensions of the mirror 60 constrained by the laser unit 42, the desired ratio is increased by increasing the length (i.e., dimension in direction of axis of rotation) of the driving magnet 62. In a preferred embodiment of the galvanometer 44, the driving magnet 62 has a length Lma that is about three times as great as the length Lmi of the mirror 60. In order to maintain a desirably low moment of inertia for the mirror member, the driving magnet 62 has a thickness D that is only about one fourth of its length Lma.

While it is desirable to make the length of the driving magnet 62 relatively long in order to achieve a high torque to inertia ratio, there are in some cases, practical limits on how long the driving magnet 62 can be made. The galvanometer 44 is often used in applications that require that it operate at low voltages. For a given voltage, there is a finite limit on the length of the driving coil 64. As the driving coil 64 is made longer in length to accommodate a longer driving magnet 62, there is an increase in the voltage required to drive current through the driving coil 64. Thus for a given operating voltage for the galvanometer 44 there is a maximum length Lma of the driving magnet 62.

As stated previously, when the galvanometer 44 is used in the thermal printers 40, or some other particular application, there is a specific size requirement for the mirror 60.

Thus, for many applications of the galvanometer 44 there is a maximum length Lma of the driving magnet 62 and a minimum size and inertia for the mirror 60. Within these constraints, we have found that it is advantageous to optimize the thickness D of the driving magnet 62.

This optimization of the thickness D of the driving magnet 62 is performed by employing the following analysis.

Consider a ratio Q of torque of inertia of the mirror member to be given by the expression:

Q = Torque / Inertia of mirror + inertia of magnet

Torque = $Kt \times r^2$; where Kt is some constant that is a function of the length of the driving magnet 62 and where r is one half of the thickness D of the driving magnet 62;

Inertia of magnet = $Ki \times r^3$; where Ki is some constant that is a function of the length of the driving magnet 62;

Inertia of mirror = Im (a constant that is a function of the mirror 60); thus Q can be written as $$Q = Kt \times r^2 / Im + (Ki \times r^2)$$

It can be noted that when r is relatively small, in the context of a particular one of the mirrors 50 and length of the driving magnet 62, the expression for Q is given by:

$$Q \approx Kt \times r^2 / Im$$

in this expression, Q increases with increasing r.

When r is relatively large in the context of a particular one of the mirrors 60 and length of the driving magnet 62, the expression for Q is given by:

$$Q \approx Kt / Ki \times r;$$

in this expression, Q decreases with increasing r.

Thus it can be seen that, for any particular combination of mirror inertia and length of the driving magnet 62, a value of r can be selected which will produce a maximum value of Q. deflection of the mirror 60. The mirror 60 is supported by widely spaced supporting members which are the springs 70. The spacing between the springs 70 is increased by placing the springs 70 at opposite ends of the driving magnet 62. In a preferred embodiment of the galvanometer 44, the spacing between the springs 70 exceeds the lengths of the mirror 60.

Referring back now to FIG. 4, there is shown a feature of the galvanometer 44 which contributes to a reduction of cross-axis deflection of the mirror 60. The springs 70 have a free length Lf that is less than one half of the thickness D of the driving magnet 62. A leaf spring has a very high resistance to cross-axis deflection when its free length is short relative to its dimension orthogonal to the free length. This concept can be better understood in the context of the galvanometer 44 by considering the details of a preferred embodiment of the spring 70.

Figure 6:
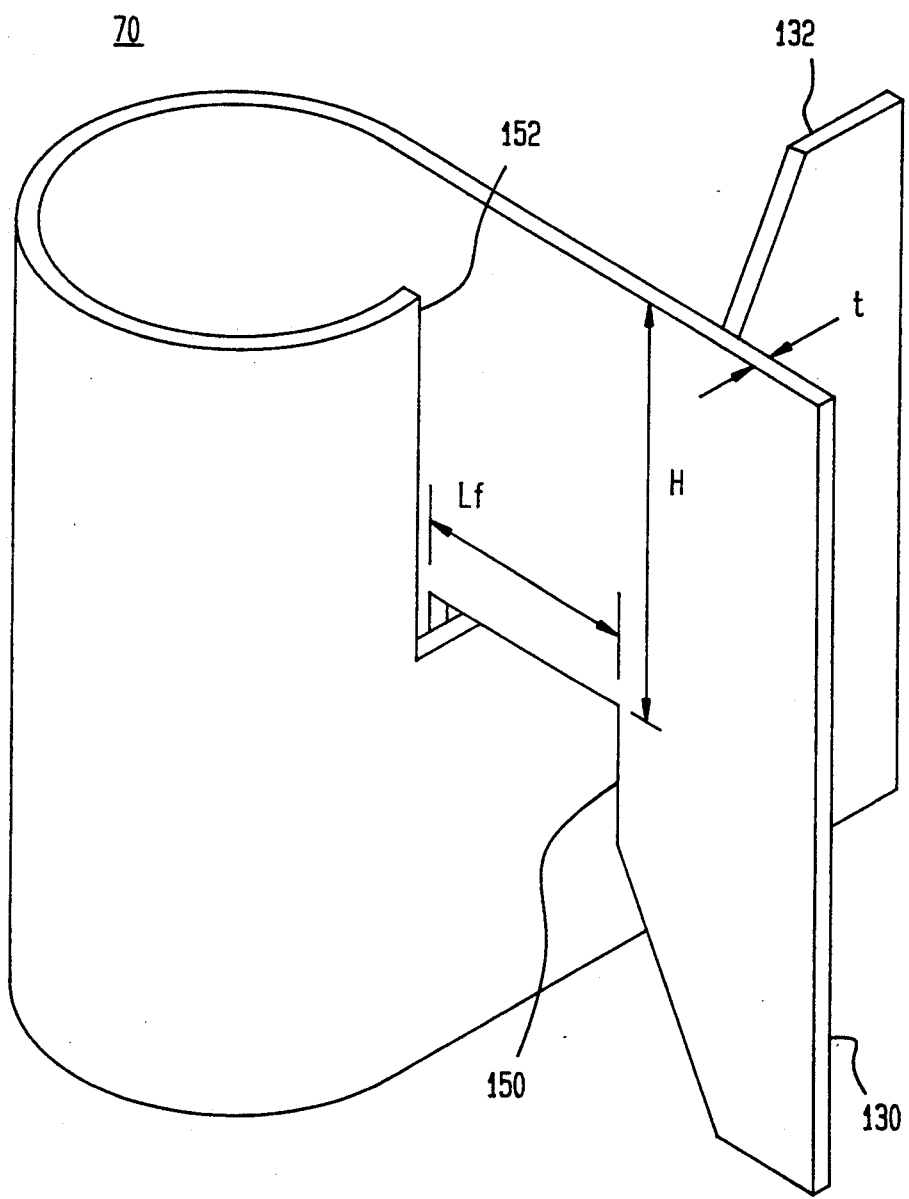
FIG. 6 shows a perspective view of a spring in accordance with the present invention.

Referring now to FIG. 6, where is shown a perspective view of the spring 70. The spring 70 can be readily deflected in a direction orthogonal to the axis of rotation 142 of FIG. 4, but is very resistant to deflection in the direction parallel to the axis of rotation 142. The spring 70 deflects in the desired direction when subjected to a force as low as a fraction of a gram. Deflections in the direction parallel to the axis of rotation 142 require applications of force that exceed four kilograms. Consequently, the spring 70 produces a mounting system for the mirror member which is very resistant to crossaxis deflection.

The spring 70 comprises a single piece of material having a uniform thickness t. There are notches 150 and 152 formed in the free ends 130 and 132, respectively, of the springs 70. The notches 150 and 152 are formed so as to leave a reduced portion of material in each of the free ends 130 and 132. Each of the reduced portions of material are shown in FIG. 6 having a height H and a length Lf (the free length shown in FIG. 4). In a preferred embodiment of the spring 70, the spring material is cold rolled stainless steel having a thickness t of 0.0015 inches. The free length Lf is 0.076 inches and the height H is 0.120 inches. It has been found that workable galvanometers of the type used in the thermal printer 40 of FIG. 1 can be produced with the dimension t being as great as about 0.007 inches, with the dimension Lf being as great as about 0.25 inches and with the dimension H being as great as about 0.36 inches. The springs 70 formed within these dimensional limits operate within the endurance limit of cold rolled stainless steel. Springs that operate within the endurance limit of the material from which they are formed typically operate for a virtually unlimited number of cycles without failure.

Corners of the notches 150 and 152 are cut away to allow clearance when the free ends 130 and 132 of the stainless steel strip are crossed over each other to form the shape shown in FIG. 6. Cutting away the corners of the notches 150 and 152 permits the springs 70 to be formed without risk of exceeding the elastic limit of the stainless steel material. Consequently, there is no need to re-temper the springs 70 after they are formed. Prior art galvanometer springs have required re-tempering after formation.

Referring back now to FIGS. 2 and 3, it can be seen that the driving magnet 62 is supported by two of the springs 70. Both ends of the driving magnet 62 are provided with one of the notches 137 shown in FIG. 4. Each of these notches has the sides 134 and 136 formed with the same predetermined angular orientation and alignment. Consequently, when the springs 70 are placed into their respective notches, the cross-over points of the free ends 130 and 132 of both of the springs 70 are aligned directly over each other. If the cross-over points were not aligned, rotation of the driving magnet 62 would produce some cross-axial forces in the springs 70. These forces would generate undesirable vibrations in the springs 70. Vibrations an "oilcan effect". Typically, when prior-art crossed flexures are used to support a galvanometer mirror, the "oilcan effect" is a problem. Efforts to eliminate this effect require expensive adjustments directed to achieving an alignment of cross-over points of the crossed flexures. These adjustments are made after assembly of the prior-art galvanometers. In the present invention, this desired alignment of cross-over points occurs without a need to make any adjustments. The shaping of the notches in the driving magnet 62 and the configuration of the springs 70 produces the desired alignment and elimination of the "oilcan effect".

The springs 70 are easy and inexpensive to produce. They can be installed into the galvanometer 44 with a minimum of effort and require no adjustment after being installed. Thus the springs 70 are particularly suitable for use in galvanometers that are to be employed in low cost thermal printers.

Figure 7:
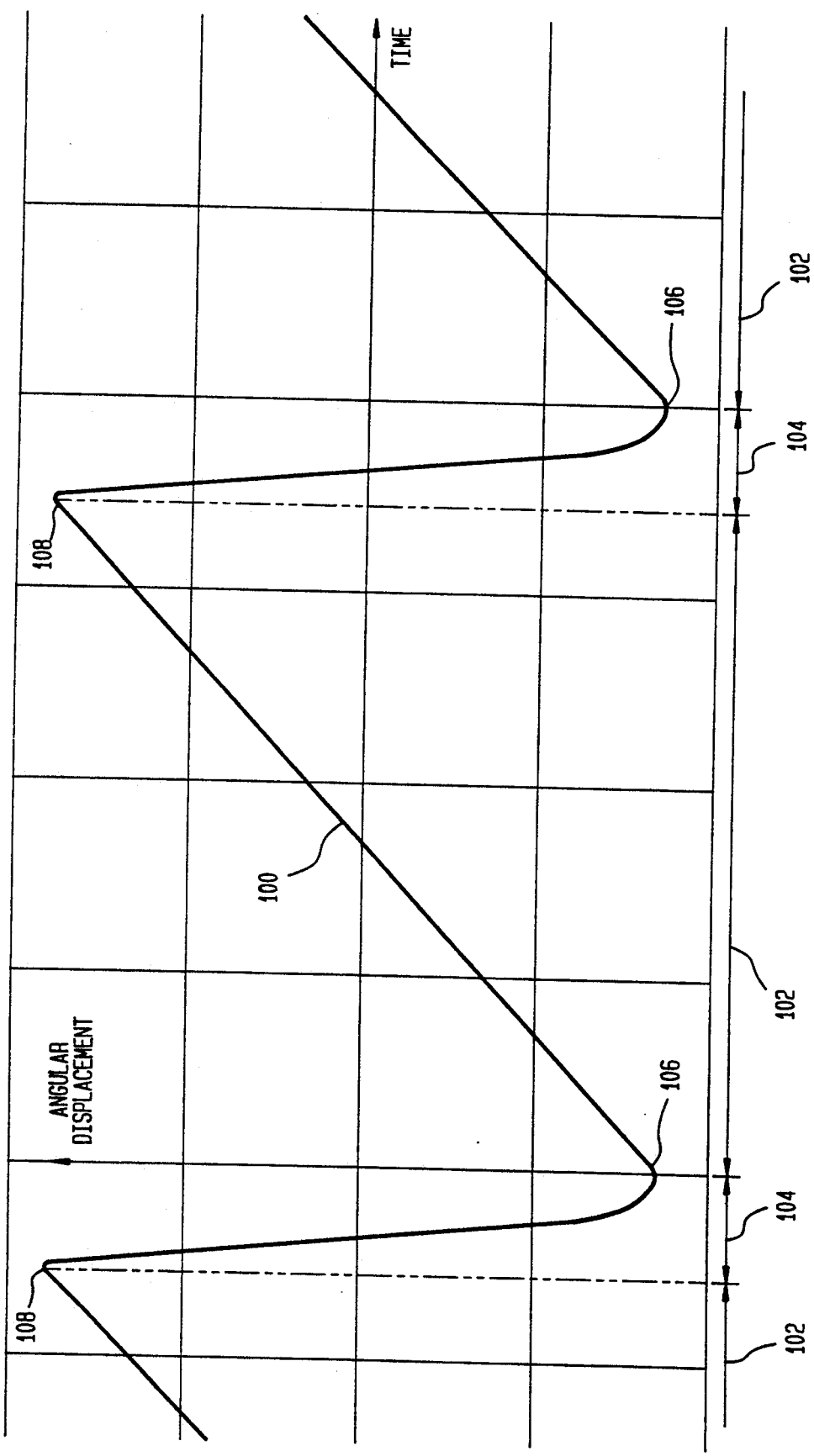
FIG. 7 shows a graphical representation of angular displacement of a mirror of the galvanometer of FIG. 3 relative to time.

Referring now to FIG. 7, there is shown a graph line 100 that shows a pattern of oscillation of the galvanometer 44. A relationship of angular displacement of the driving magnet 62 and the mirror 60 as a function of time is shown, with time on the horizontal axis of the chart and angular displacement on the vertical axis. One complete cycle of a time period represented in FIG. 7 comprises a scan period 102 and a retrace period 104. Points 106 and 108 on the graph line 100 represents angular positions of the mirror 60 at a beginning and end of the scan period 102, respectively. When the mirror 60 is at the position of point 106, the laser unit 42 of FIG. 1 is activated and printing of one line of an image on the workpiece 50 begins. The scanning continues in time with the angular displacement of the mirror 60 changing linearly as a function of time. At a point in time shown by the numeral 108, the scanning is discontinued, i.e., the laser unit 42 is deactivated. The mirror 60 is then rapidly returned to the position shown by the numeral 106. The movement of the mirror 60 during transition from the point 108 to the point 106 is known as a retrace.

It is important to a successful operation of the thermal printer 40 that the scan and the retrace of the mirror 60 take place in a precisely controlled manner. The angular velocity of the mirror 60 must be constant at the beginning of the scan period 102, i.e., at point 106.

Figure 8:
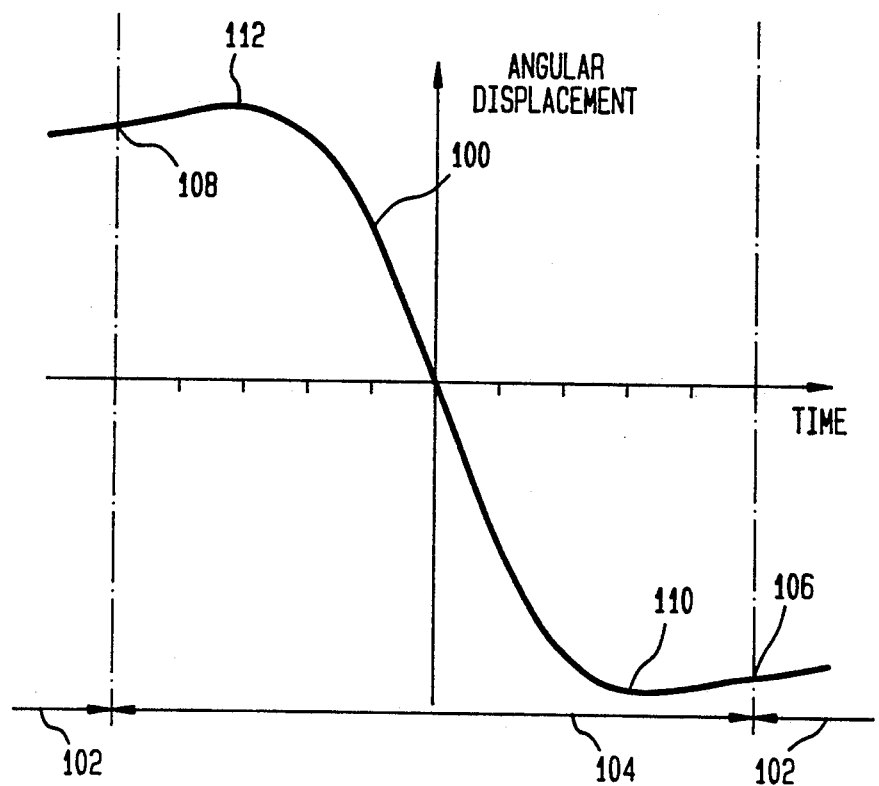
FIG. 8 shows a detailed view of a portion of the graphical representation of FIG. 7.

Referring now to FIG. 8, there is shown an enlarged view of a portion of the graph line 100 of FIG. 7 that is associated with the retrace period 104. In addition to the two points 106 and 108 shown in FIG. 7, the portion of the graph line 100 shown in FIG. 8 comprises two points 110 and 112 which represent points in time when the mirror 60 has an effective angular velocity of zero. It should be noted that the points 110 and 112 are outside of the scan period 102 of FIG. 7. In other words, the mirror 60 moves at a constant velocity (i.e., without any acceleration) during the scan period 102. It should also be noted (by referring to FIG. 7) that the retrace period 104 is only about 15% of a total cycle of oscillation (the scan period 102 plus the retrace period 104) of the mirror 60. These factors require that the mirror 60 must be accelerated rapidly twice during the retrace period 104.

Figure 9:
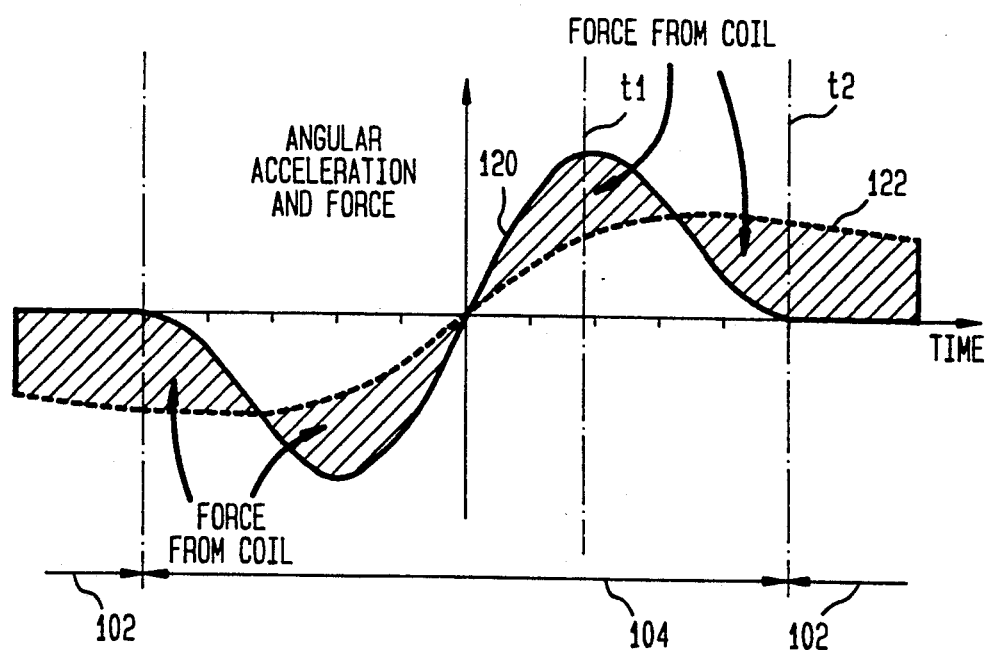
FIG. 9 shows a graphical representation, relative to time, of acceleration of the mirror of the galvanometer of FIG. 3 and a graphical representation of forces acting on the mirror.

Referring now to FIG. 8, there is shown a graphical representation of angular accelerations of the mirror 60 (on the vertical axis) as a function of time (on the horizontal axis). Additionally, FIG. 9 shows a graphical representation of forces required to be applied to the mirror 60 as a function of time in order for the mirror to accelerate as needed. The graphical representation of FIG. 9 comprises a mirror acceleration and mirror force graph line 120 (shown as a solid line) and a spring force graph line 122 (shown as a dashed line). the graph lines 120 and 122 are oriented in time to correspond to the angular displacement graph line 100 of FIG. 8. Thus the graph line 120 illustrates the magnitude and direction of acceleration needed to achieve the dynamic angular displacement of the mirror 60 which is represented by the graph line 100 in FIG. 8. Additionally, because force is proportional to acceleration, the graph line 120 represents the magnitude and direction of force which must be applied to the mirror 60 in order to achieve the dynamic angular displacement represented by the graph line 100.

The force applied to the mirror 60 during operation of the galvanometer 44 is provided from two sources. A first source is a magnetic field generated by the driving coil 64 operating to rotate the driving magnet 62. A second source of force is the restorative forces of the springs 70 (i.e., forces produced by the energy stored in the springs during the scan period 102). These two sources of force are graphically illustrated in FIG. 9. Graph line 122 shows the magnitude and direction of force generated by the springs 70. Graph line 120 shows the magnitude and direction of a total required force needed to produce the acceleration that is also represented by the graph line 120. It can be seen that at some times the spring force exceeds the required amount while at other times the spring force is insufficient. The differentials between the spring force and the required force are provided by the current in the driving coil 64 generating a magnetic field that produces torque in the driving magnet 62. Shaded areas between the graph lines 120 and 122 represent the magnitude and direction of the forces produced by the driving coil 64 during the retrace of the mirror 60.

For example, at a time t1 on FIG. 9, the graph line 120 shows that the force required to produce a desired acceleration exceeds the force produced by the springs 70 shows by the graph line 122. Consequently, the coil 64 is required to produce a positive supplemental force represented by the shaded area between the lines 120 and 122 at time t1. At a later time t2 on FIG. 9, the graph line 120 shows that the force required to produce a desired acceleration is less than the amount of force produced by the springs 70. In this case, the coil 64 must produce a force that is opposite in magnitude from the force of the springs 70, in other words, a braking action.

The galvanometer 44 is constructed so that the mirror 60 is moved through tis retrace period 104 at a speed that corresponds approximately to the speed at which the mirror 60 would move if it were permitted to oscillate in a resonant mode. This concept can be understood by considering a natural frequency of a preferred embodiment of the galvanometer 44. In a preferred embodiment, the thermal printer 40 of FIG. 1 produces 20 scans per second. A full oscillation of the mirror 60 is divided into 85% for scan and 15% for retrace. Thus the time allotted for retrace is 7.5 milliseconds. This means that if the natural frequency of oscillation of the combined mirror 60, driving magnet 62 and springs 70 were approximately 70 hertz, the retrace could be performed with spring force only. Consequently, for use in the thermal printer 40, the galvanometer 44 is constructed so that the natural frequency of oscillation of the mirror 60 is in a range of about 50 to 120 hertz.

When the speed of the retrace is in the range of the natural frequency of the galvanometer 44, the forces produced by the driving coil 64 can be kept at a low level and the power requirements of the galvanometer 44 are kept desirably low. In the preferred embodiment of the galvanometer 44, the coil is sued only to perform a desired shaping of the retrace acceleration to assure that the mirror 60 has indeed reached a constant angular velocity at point 106 of FIG. 8 before the scan period 102 begins. Operation of the galvanometer 44 with a retrace that corresponds approximately to its natural frequency provides for a smooth transition from the retrace period 104 to the scan period 102 of each cycle of oscillation of the mirror 60.

It has been found that when the retrace is performed in a time less than one fifth of the period of the natural frequency then the galvanometer 44 requires inordinate amounts of power at excessively high peak voltages. Additionally, such gross mismatches between retrace speed and natural frequency result in the introduction of vibrations in the mirror 60 which produce deleterious effects on the image produced by the thermal printer 40.

In order to produce a desired angular displacement to time relationship for the galvanometer 44 there is a need to determine the angular position of the mirror 60 at any given time. This position determination is made by using signals produced by the Hall effect sensor 90 shown in FIG. 2. The Hall effect sensor 90 operates in accordance with well known principles to measure changes in a magnetic field which are produced by movement of the sensor magnet 82 of FIG. 2. The sensor magnet 82 is coupled to the driving magnet 62. Therefore, the position of the sensor magnet 82 is indicative of the angular position of the driving magnet 62 and the mirror 60.

Figure 10:
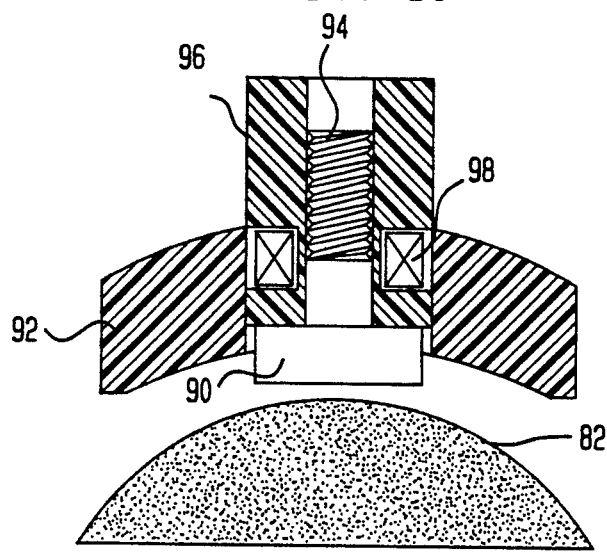
FIG. 10 shows a partial cross-sectional view of the galvanometer of FIG. 3 taken along the dashed lines 10—10 of FIG. 3.

Referring now to FIG. 10, there is shown a partial cross-sectional view of the galvanometer 44 of FIG. 3 taken along the dashed lines 10—10 of FIG. 3. This view shows in detail a physical relationship of the sensor support 92, the null slug holder 96, the null slug 94 and the compensating coil 98. The Hall effect sensor 90 (hereinafter sensor 90) is coupled to the sensor support 92 with an adhesive. The compensating coil 98 is wound around the null slug holder 96 in a groove formed therein. In a preferred embodiment, the null coil 98 is comprised of thirty turns of No. 36 copper wire. The null slug holder 96 is coupled to the sensor support 92 with a surface thereof adjacent a surface of the sensor 90. The compensating coil 98 is positioned inside the sensor support 92. The null slug 94 is coupled to the null slug holder 96 with a threaded connection formed in the null slug holder 96. The null slug 94 is adapted to move longitudinally along the null slug holder 96 (by being turned as a screw) so that a gap between the null slug 94 and the sensor 90 can be adjusted as required.

In a preferred embodiment, the sensor magnet 82 is positioned so that it is approximately 0.010 inches from the sensor 90 with a positioning error tolerance of ±0.005. It has been found that the sensor magnet 82 may be as far away from the sensor 90 as 0.050 inches while still achieving a workable galvanometer. In the context of mass production of galvanometers, an opportunity to use spacing with this degree of latitude is, of course, a very desirable advantage. Galvanometers which use magnetic position sensors can be made at a much lower cost than prior art galvanometers which use capacitor based position sensors. This is because capacitor based position sensors require controlled spacing between sensing elements in the order of 0.001 inches or less with tolerances of ±0.0002 inches or less.

In operation, the sensor 90 produces a signal that is indicative of the angular position of the sensor magnet 82. In order to produce an accurate position signal, the sensor 90 is provided with a system that eliminates distorting effects of the magnetic field generated by the driving coil 64 and the driving magnet 62. If these magnetic fields were left to operate on the sensor 90, the sensor would produce virtually useless signals. The sensor 90 would indicate the strength of varying magnetic fields in its vicinity but it would not necessarily indicate the position of the sensor magnet 82.

Hall effect sensors have heretofore not been employed in beam scanning galvanometers. In a typical galvanometer, a driving magnet has its own magnetic field and operates in another magnetic field that is generated by a driving coil. The net effect of this mode of operation is that there is no point at which the magnitude of a mirror driving magnetic field is linearly related to an angular position of a mirror. Consequently, we know of no prior art application of a Hall effect sensor to sense the angular position of an oscillating galvanometer mirror.

The present design of the galvanometer 44 overcomes this problem by producing a second and separable magnetic field which is indicative of the angular position of the mirror 60. A position indicating magnetic field is produced by the sensor magnet 82 which is separate and apart from the magnetic field that produces torque on the driving magnet 62. Nevertheless, in spite of using the separate sensor magnet 82, there is still a need to take cognizance of the magnetic fields generated by the driving magnet 62 and the driving coil 64.

Figure 11:
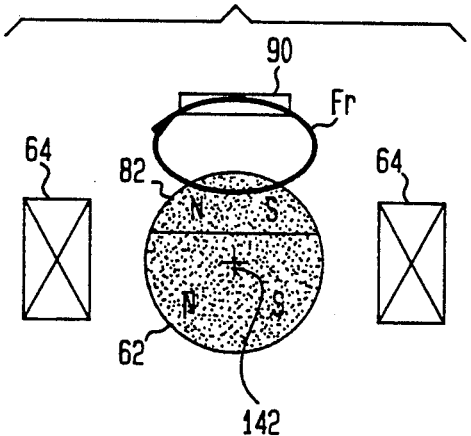
FIG. 11 shows, symbolically, portions of the galvanometer of FIG. 3 and a first magnetic field acting thereon.
Figure 12:
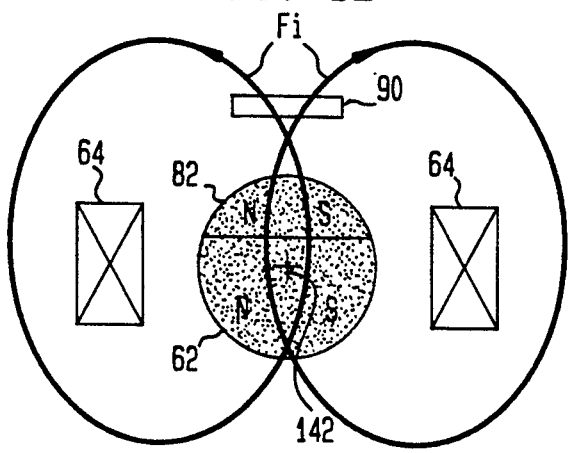
FIG. 12 shows, symbolically, the same portions of the galvanometer of FIG. 11 but with a second magnetic field acting thereon.

Referring now to FIGS. 11 and 12, there are shown schematic diagrams of the interaction of the various magnetic fields in the galvanometer 44. FIGS. 11 and 12 show symbolically the driving magnet 62, the driving coil 64, the sensor magnet 82 and the sensor 90 of FIG. 2. In FIG. 11, a magnetic field Fr is shown being produced by the sensor magnet 82. The field Fr acts on the sensor 90 and the sensor 90 produces a signal that varies as a function of the angular position of the sensor magnet 82 relative to the axis of rotation 142 of FIG. 4. Within the limited amount of rotation of the driving magnet 62 (less than 16° in the preferred embodiment of the galvanometer 44), the output signal from the sensor 90 varies linearly with rotation of the sensor magnet 82.

FIG. 12 shows another magnetic field Fi being produced by current in the driving coil 64. This field Fi also operates on the sensor 90 and causes the sensor 90 to produce a signal that is a function of the magnitude of the field Fi. The magnitude of the field Fi is a function of the amount of current passing through the driving coil 63 at any given time. Because rotation of the driven magnet 62 is partially controlled by the forces generated by the springs 70 of FIG. 2, the angular position of the driving magnet 62 is not linearly related to the magnitude of the current in the driving coil 64. Consequently, the field Fi is not linearly related to the angular position of the driving magnet 62.

If the two magnetic fields Fi and Fr were to freely act on the sensor 90, the sensor 90 would produce signals that would not be indicative of the angular position of the sensor magnet 82. It is therefore necessary to provide a compensating system that eliminates the undesired effects of the field Fi on the sensor 90.

Figure 13:
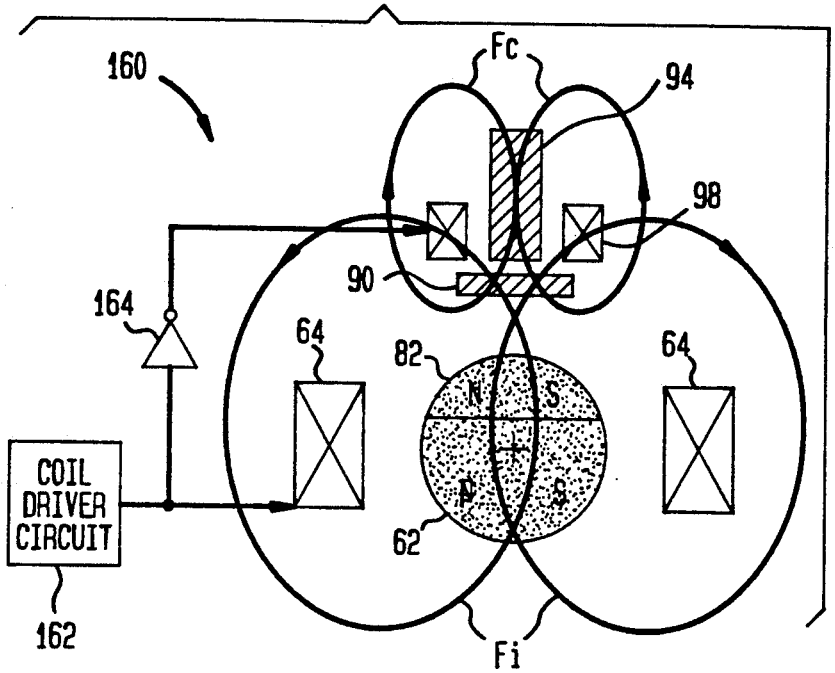
FIG. 13 shows, in schematic block diagram format, a first compensating circuit which finds utility in the operation of the galvanometer of FIG. 3.

Referring now to FIG. 13, there is shown symbolically, a portion of the galvanometer 44 which is utilized for achieving the desired compensation of output signal of the sensor 90. FIG. 13 shows symbolically a compensating circuit 160 that comprises the driving coil 64 and the compensating coil 987 of FIG. 2, and a coil driver circuit 162 and an inverter 164. The coil driver circuit 162 is disclosed and claimed in a U.S. Pat. application entitled "Improved Method and Circuit for Driving an Electro-Mechanical Device Rapidly with Great Precision", filed concurrently herewith and identified in the Related Pat. applications section hereinabove. Also shown in FIG. 13 are the driving magnet 62, the sensor magnet 82, the sensor 90 and the null slug 94 of FIG. 2.

An output of the coil driver circuit 162 is coupled to the driving coil 64 and an input of the inverter 164. An output of the inverter 164 is coupled to the compensating coil 98.

In operation, the compensating circuit 160 produces a magnetic field Fc which is, at any given time, opposite in polarity from the magnetic field Fi of FIG. 12. The field Fc is not, in general, the same magnitude as the field Fi. However, the field Fc is produced in very close proximity to the sensor 90. Consequently, in the localized region of the sensor 90, the effective magnitudes of the two fields Fc and Fi are substantially equal. Because the two fields Fc and Fi always have opposite polarities, their combined effect on the sensor 90 is substantially zero. In order to achieve an total cancellation of the effects of the field Fi, the null slug 94 is moved toward or away from the sensor 90. The null slug 94 is a rod of material having a high magnetic permeability, such as soft iron, nickel or ferrite. Its position relative to the compensating coil 98 effects the magnitude of the magnetic field which the compensating coil 98 produces. Thus by adjusting the position of the null slug 94, the compensating coil 98 is tuned to produce a magnetic field which exactly cancels the effect of the field Fi on the sensor 90.

Figure 14:
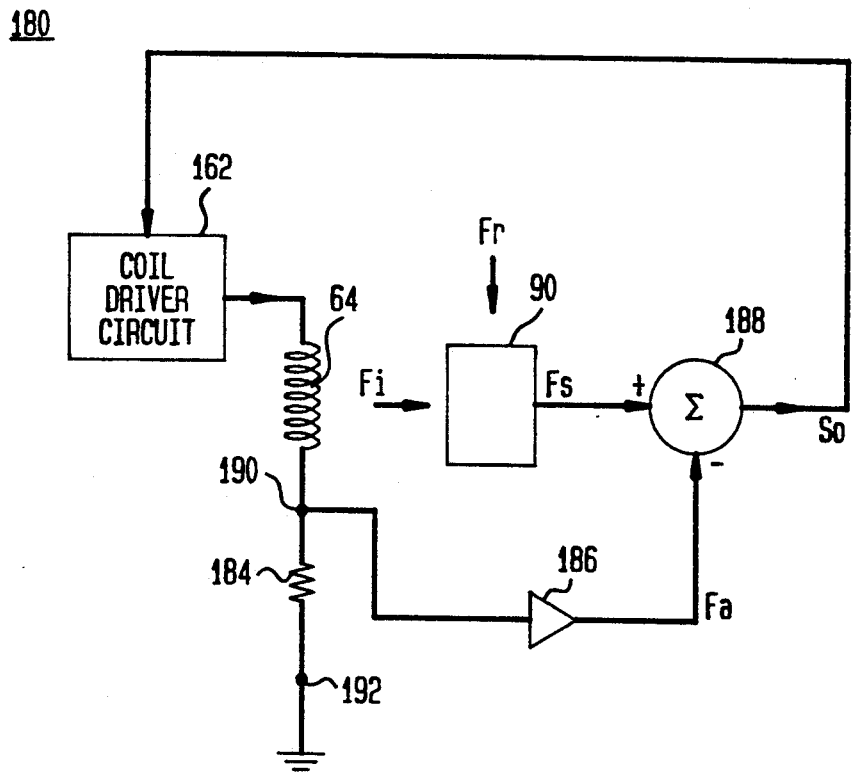
FIG. 14 shows, in schematic form, a second compensating circuit which finds utility in the operation of the galvanometer of FIG. 3.

Referring now to FIG. 14, there is shown another technique for producing a desired compensation for the sensor 90. FIG. 14 shows a compensation circuit 180. The compensation circuit 180 comprises the coil driver circuit 162 of FIG. 13, a resistor 184, an amplifier 186 and an adder 188 combined with the driving coil 64 and the sensor 90 of FIG. 2. The coil driver circuit 162 is coupled at an output thereof to a first terminal of the driving coil 64. A second terminal of the driving coil 64 is coupled to a terminal 190, to an input of the amplifier 186 and to a first terminal of the resistor 184. The second terminal of the resistor 184 is coupled to a terminal 192 and to a reference voltage which is shown as ground. An output of the amplifier 186 is coupled to a first input of the adder 188. An output of the sensor 90 is coupled to a second input of the adder 188. An output of the adder 188 is coupled to an input of the coil driver circuit 162. FIG. 13 also shows symbolically that the sensor 90 is effected by the two magnetic fields Fi and Fr of FIGS. 11 and 12.

In operation, the compensation circuit 180 of FIG. 14 produces a modification of an output signal from the sensor 90. The modification is a function of the current passing through the driving coil 64 and effectively eliminates a portion of the output signal from the sensor 90 that is produced by the magnetic field Fi. This is achieved by selecting a gain K for the amplifier 186 in accordance with the following expression: $K = -H(Fi/i)$, where H is a gain of the sensor 90, and where i is the current passing through the resistor 184. The adder 188 produces an output which is equal to the sum of its two input signals. An input signals Ss from the sensor is given by the expression: $Ss = H \times Fi + H \times Fr$. An input signal Sa from the amplifier 186 is given by the expression: $Sa = K \times i$ or $-H(Fi/i) \times i$. When Sa is added to Ss, the resulting output signal So from the adder 188 is given by the expression: $So = H \times Fr$. This output signal So, which is indicative exclusively of the angular position of the sensor magnet 82 of FIG. 2, is used as a feedback signal by the coil driver circuit 162 to drive a proper amount of current through the driving coil 64 to produce the desired movement of the mirror 60 of FIG. 2.

The gain H of the sensor 90 is a function of magnetization of the sensor magnet 82 and the size of an air gap between the sensor 90 and the sensor magnet 82. Since these factors vary for each of the galvanometers 44, there is a need to choose a unique value of amplifier gain K for each one of the galvanometers.

The compensating systems described above are particularly useful when the galvanometer 44 of FIG. 2 is used in one of the thermal printers 40 of FIG. 1 that produces high resolution images (i.e., 2000 dots per inch or greater). When the mirror 60 of FIG. 2 is scanned to produce many discreet incremental changes of driving current emanating from the coil driving circuit 162. Each o these changes are produced only for a brief period of time. In other words they can be considered to be control pulses. It has found desirable to produce these control pulses at a frequency of about 2 KHz to achieve a resolution of an image in the order of 2000 dots per inch.

Thus, in a preferred embodiment of the thermal printer 40, the sensor 90 must be capable of producing accurate position information at frequency of 2 KHz or higher. In such a high frequency application, it is particularly critical to provide for elimination of effects of magnetic fields of the driving coil 64 on the sensor 90. The reason for this can be understood by considering a responsiveness of the sensor 90 as a function of frequency.

Figure 15:
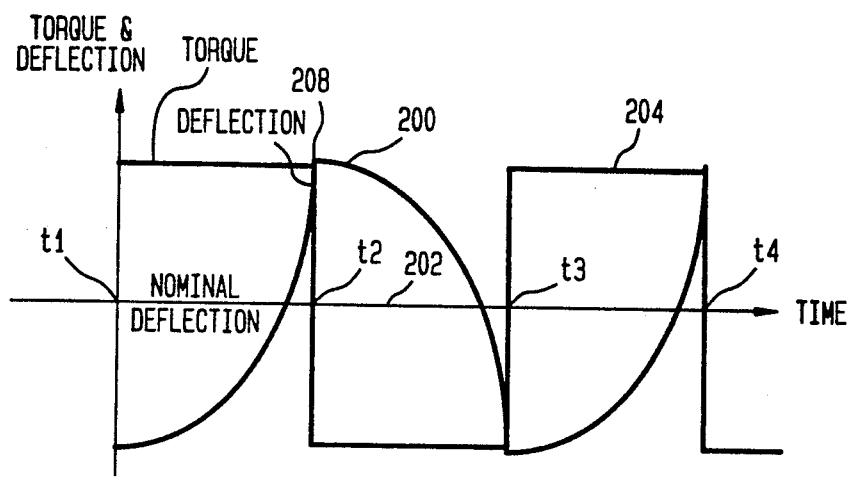
FIG. 15 shows a graphical relationship between time, a torque applied to a mirror of the galvanometer of FIG. 3 and a resultant deflection of the mirror.

Referring now to FIG. 15, there is shown a graph line 200 that is a representation of a hypothetical incremental deflection of a hypothetical incremental deflection on the mirror 60 relative to a desired nominal deflection graph line 202. FIG. 15 also shows a torque graph line 204 representative of a hypothetical torque needed to produce the deflection of the mirror 60 represented by the graph line 200. The deflection graph line 200 and the torque graph line 204 are shown increasing and decreasing along a vertical axis of FIG. 15 relative to time which is shown along a horizontal axis. The nominal deflection graph line 202 is representative of a desired deflection of the mirror 60 at some time in the scan period 102 of FIG. 7. The nominal deflection graph line 202, for purposes of clarity, is shown as a straight line even though in an actual embodiment of the galvanometer 44, the nominal deflection of the mirror 60 varies as a function of time.

FIG. 15 shows that when a torque is applied to the mirror 60 with a step as a function of time, the mirror 60 begins to accelerate at a beginning of the application of the torque, see time t1 for example. As the torque application continues during the step, the mirror continues to accelerate and overshoots the desired nominal deflection position, see time t2 for example. In order to bring the mirror 60 to the nominal deflection position, a torque of reverse magnitude is applied to the mirror 60 at time t2. The mirror 60 begins to accelerate in the direction of the nominal deflection position, but overshoots that position at time t3. Once again, torque is applied to drive the mirror 60 to the nominal deflection position at time t3.

Deflection of the mirror 60 during acceleration varies as a function of time squared. Consequently, if the acceleration period of the mirror 60 is reduced in time, the resultant deflection of the mirror 60 is reduced by a quadratic factor.

Figure 16:
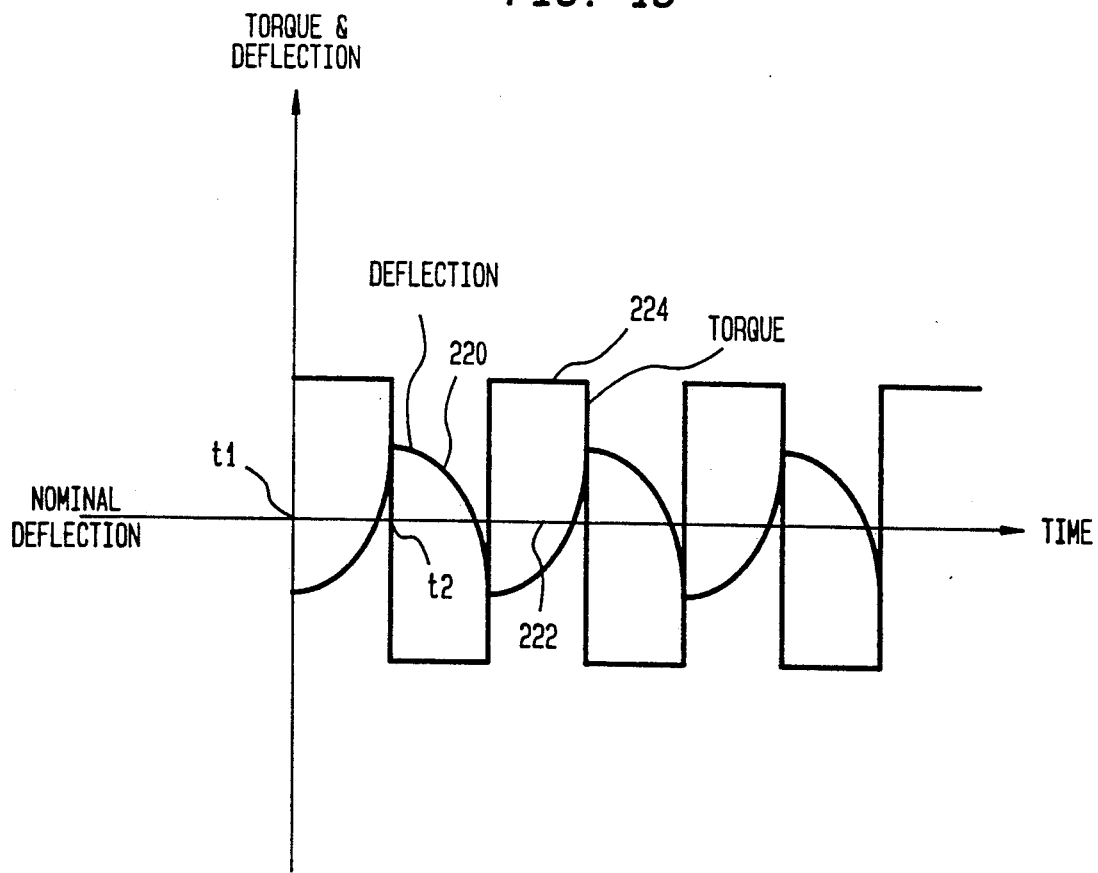
FIG. 16 shows the same graphical relationship as FIG. 15 but with torque being applied at a higher frequency.

Referring now to FIG. 16, there is shown a graphical representation of a hypothetical incremental deflection graph line 220 of the mirror 60 and a hypothetical torque graph line 224 relative to a desired nominal deflection graph line 222. FIG. 16 shows the torque graph line 224 representing the same magnitude of torque as the graph line 204 of FIG. 15. The frequency of application of torque is shown in FIG. 16 as being twice the frequency shown in FIG. 15. The deflection graph line 220 and the torque graph line 224 are shown increasing and decreasing along a vertical axis of FIG. 16 relative to time which is shown along a horizontal axis. The time represented in FIG. 16 is the same as the time represented in FIG. 15. As was the case in FIG. 15 for the graph line 202, the nominal deflection graph line 222 is representative of a desired deflection of the mirror 60 t some time in the scan period 102 of FIG. 7.

FIG. 16 shows that when a torque is applied to the mirror 60 with a step as a function of time, the mirror 60 begins to accelerate at a beginning of the application of the torque, see time t1 for example. As the torque application continues during the step, the mirror 60 continues to accelerate and overshoots the desired nominal deflection position, see time t2 for example. It can be seen, however, that the overshooting of the mirror 60 is substantially less than in FIG. 15. This is because the mirror 60 accelerates for a period of time that is only half of the time of FIG. 15 since the frequency of application of correction torque steps if doubled.

As a general matter, increasing the frequency of application of correction torques reduces the overshooting of deflection by a factor of four with each doubling of the frequency. Thus, application of correction torques at a high frequency is a desirable technique for accurately controlling the deflection of the mirror 60 so that it follows a desired nominal deflection path.

Figure 17:
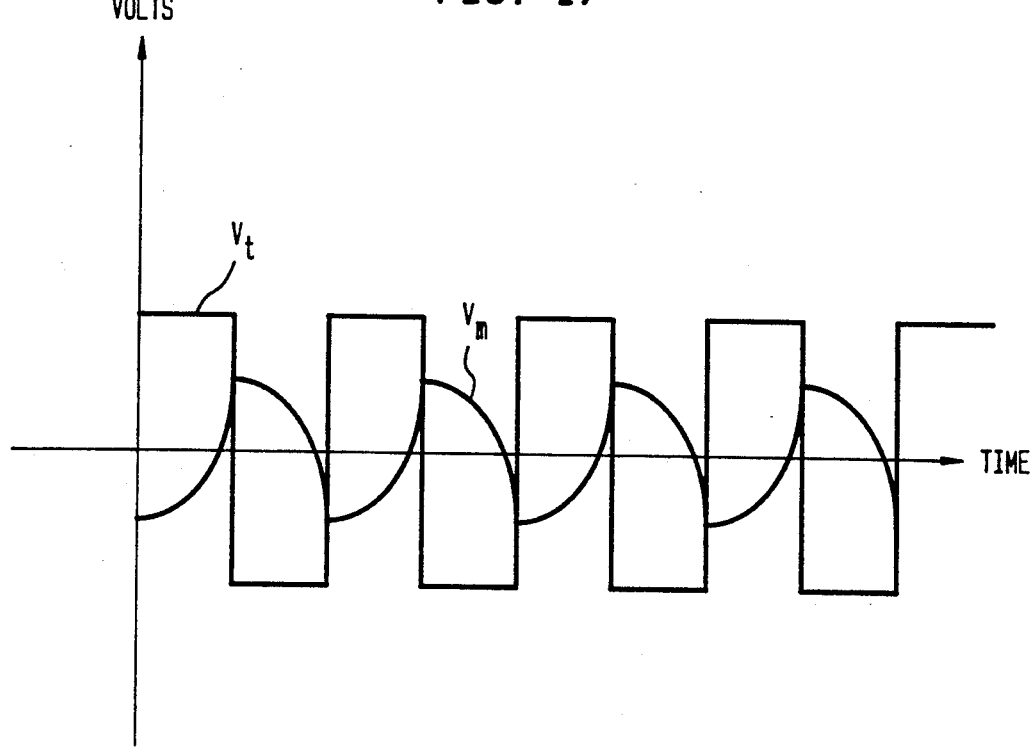
FIG. 17 shows a graphical relationship of time and various voltage outputs of a sensor of the galvanometer of FIG. 3.

Referring now to FIG. 17, there is shown a graphical representation of two components of a voltage output of the sensor 90 as these components would appear in the context of the sensor 90 responding to the hypothetical activity shown in FIG. 16. A first graph line Vt is representative of a voltage that is generated in the sensor 90 by a magnetic field that produces the torque of the torque graph line 224 of FIG. 16. A second graph line Vm is representative of a voltage that is generated in the sensor 90 by a deflection of the mirror 60 as represented by the graph line 220 of FIG. 16. The graph line Vt has the same shape as the graph line 224 of FIG. 16 because the torque needed to drive the mirror 60 is proportional to the flux of the magnetic field needed to produce the torque. The graph line Vm has the same shape as the graph line 220 of FIG. 16 because the deflection of the mirror 60 produces a voltage in the sensor 90 that is proportional to the deflection.

Figure 18:
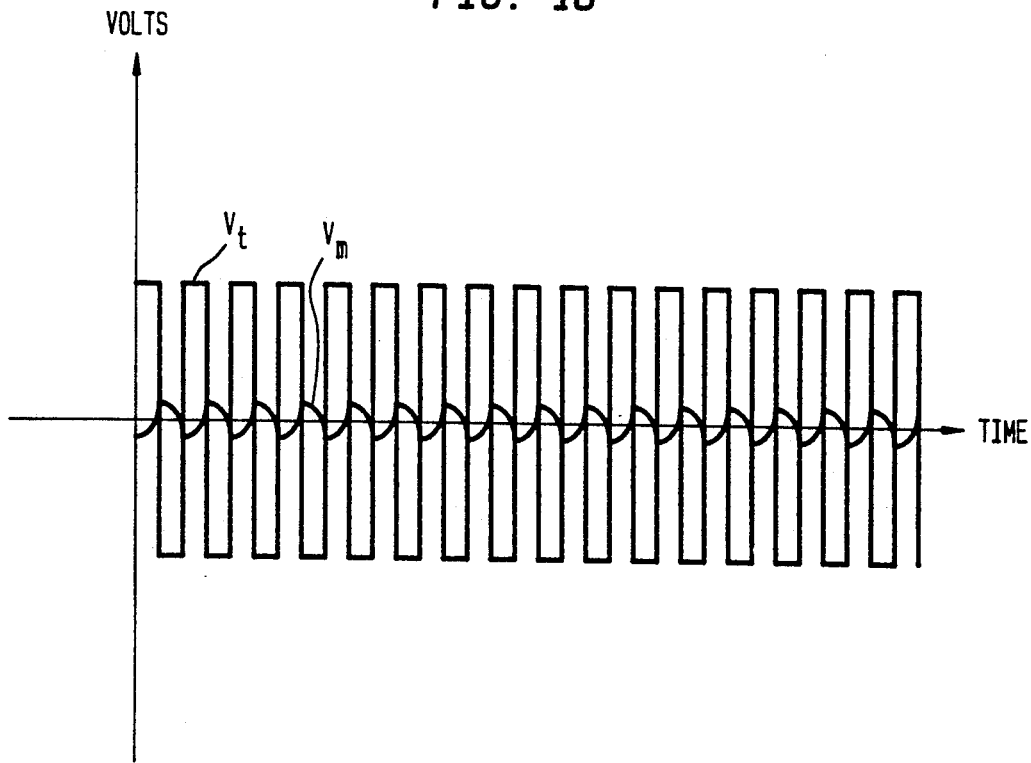
FIG. 18 shows the same graphical relationship as FIG. 17 but with a higher frequency of application of torque to a mirror of the galvanometer of FIG. 3.

Referring now to FIG. 18, there is shown a graphical representation of the voltages Vt and Vm of FIG. 17, but with a higher frequency of application of torque that produces the voltage Vt. The frequency illustrated in FIG. 18 is four times as great as the frequency illustrated in FIG. 17. The magnitude of Vm varies as a function of the square of the time during which the mirror 60 is accelerated during one application of correction torque. When the frequency of application of the torque is increased by a factor of four, the magnitude of Vm decreases by a factor of sixteen. The magnitude of the voltage Vt is not effected by the frequency at which correcting torque is applied to the mirror 60. Thus, the graph line Vm in FIG. 18 shows the magnitude of the voltage Vm being very small relative to the magnitude of the voltage Vt.

Figure 19:
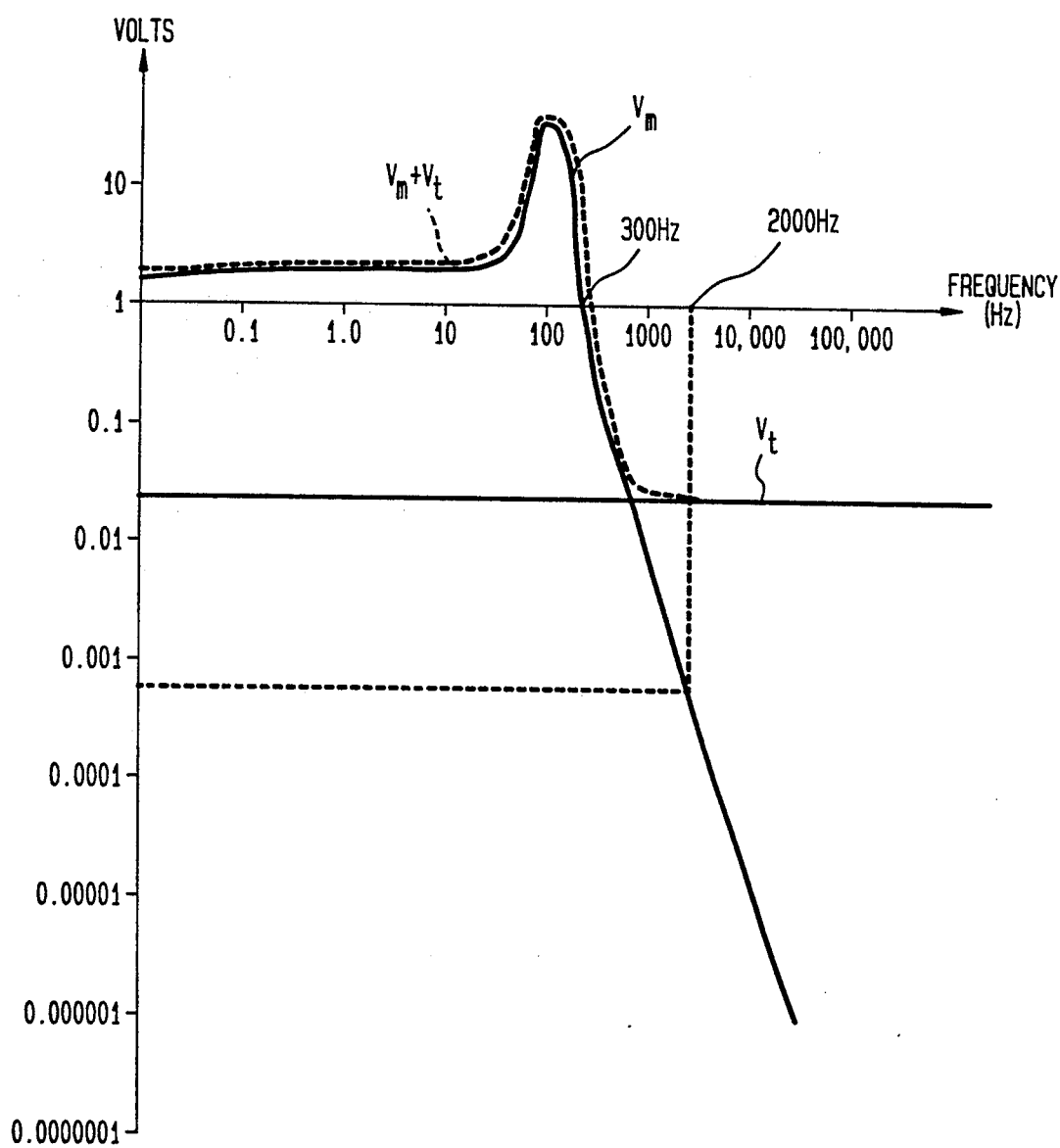
FIG. 19 shows a graphical relationship between frequency of application of torque and various voltage outputs of the sensor of the galvanometer of FIG. 3.

Referring now to FIG. 19, there is shown a frequency domain graphical representation of the relationship between the voltages Vt and Vm in a preferred embodiment of the galvanometer 44 of FIG. 2. A graph line Vm+Vt (shows as a dashed line) illustrates an actual output voltage from the sensor 90. FIG. 19 shows various logarithmic values of voltage on a vertical axis and various logarithmic values of frequency on a horizontal axis. Graph lines Vm and Vt (shows as solid lines) illustrate voltage outputs from the sensor that result from a given amount of torque being applied to the mirror 60. It can be seen that the mirror 60 deflects a different amount for the given amount of torque depending on the frequency at which the torque is applied. At frequencies below a resonant frequency of the galvanometer 44 (e.g., about 100 Hz), inertial resistance of the mirror 60 is low so that a given torque produces a substantial deflection of the mirror 60. Consequently, a substantial voltage Vm (i.e., greater than 1 volt) is produced by the sensor 90 in response to the torque. At frequencies that are close to resonance, the voltage Vm is extremely high because very little torque is needed to cause the mirror 60 to oscillate in a resonant mode. At frequencies higher than the resonant frequency, the voltage Vm decreases rapidly as a function of increasing frequency. This is because inertial resistance of the mirror 60 becomes a dominant factor in the overall deflection resistance of the mirror 60 and the springs 72 of FIG. 2. At a frequency of 300 Hz, Vm enters a range in which it is not significantly greater than Vt (Vt being the voltage produced by the sensor 90 in response to the magnetic field that produces torque on the mirror 60). At a frequency of 2 KHz and higher, the composite graph line Vm+Vt has substantially the same shape as the graph line Vt. In other words, the output voltage of the sensor 90 is completely dominated by the effects of the magnetic field that drives the mirror 60.

Thus it can be seen that when the correction pulses of torque are applied at the desired rate of 2 KHz or higher, it is impossible to use the sensor 90 to determine the position of the mirror 60 without using a compensation system such as one of those described above.

It is to be appreciated and understood that the specific embodiments of the invention are merely illustrative of the general principles of the invention. Various modifications may be made by those skilled in the art which are consistent with the principles set forth. For example, the galvanometer can be made to operate at scanning frequencies greater or less than the 20 scans per second which are described as an operating speed for the thermal printer described in the Detailed description. Furthermore, the galvanometer can be used in applications other than thermal printing of transparencies.

What is claimed is:

1. A beam scanning galvanometer having a mirror member supported with at least one spring which comprises:

a metallic strip having a substantially uniform thickness throughout and having first and second sides substantially parallel to each other;

the first side of the metallic strip having a first notch formed therein which extends more than one half of the distance between the first and second sides;

the second side of the metallic strip having a second notch formed therein which extends more than one half of the distance between the first and second sides; and the metallic strip being formed into a configuration in which the first and second notches overlie each other.

2. The beam scanning galvanometer of claim 1 wherein a portion of the first side of the metallic strip adjacent the first notch is substantially perpendicular to a portion of the second side of the metallic strip adjacent the second notch.

3. The beam scanning galvanometer of claim 1 wherein:

the first and second notches are displaced from each other a determined distance; and the spring comprises a curved portion formed in the determined distance between the two notches.

4. The beam scanning galvanometer spring of claim 3 wherein the curved portion comprises a portion of a cylinder.

5. The beam scanning galvanometer of claim 1 wherein the spring is formed from a single, substantially flat, piece of cold rolled steel and the temper of the steel of the spring remains unchanged from the original temper of the cold rolled steel from which the spring is formed.

6. The beam scanning galvanometer of claim 1 wherein the spring has a thickness less than about 0.007 inches.

7. The beam scanning galvanometer of claim 1 wherein the spring has a free length less than about 0.025 inches.

8. The beam scanning galvanometer of claim 1 wherein the spring has a height less than about 0.360 inches.

9. The beam scanning galvanometer of claim 1 wherein the spring has a thickness less than about 0.007 inches, a free length less than about 0.250 inches and a height less than about 0.360.

10. The beam scanning galvanometer of claim 1 wherein the spring has a free length that is less than its height.

11. The beam scanning galvanometer of claim 1 wherein the mirror member has a thickness and the springs have a free length which is less than about half of the thickness of the mirror member.

12. A beam scanning galvanometer comprising:
a mirror attached to a substantially cylindrical member having a thickness;
the member being rotatably supported on springs;
the mirror having a thickness;
the mirror having an axis of oscillation that is displaced from a reflecting surface of the mirror a first distance; and
the first distance being no greater than about the thickness of the mirror plus one half of the thickness of the member.

13. Apparatus for scanning a beam of light across a surface of a workpiece, said apparatus comprising:
a movable mirror member;
at least two sets of crossed spring members adapted to moveably support the mirror member;
each spring member having two free ends;
the mirror member having at least two substantially identical notches formed therein;
each of the notches having two planar sides;
each of the planar sides being oriented at a predetermined angle relative to the other planar side; and
each of the planar sides being adapted for attachment to one of the free ends of one of the spring members so as to produce an alignment of the cross-over points of the spring members.

14. A beam scanning galvanometer comprising:
a mirror attached to a magnet;
the magnet being rotatably supported on springs;
the magnet being surrounded with a driving coil having a center of force; and
the mirror having an axis of oscillation that is substantially aligned with the center of force of the coil.

15. A beam scanning galvanometer comprising:
a mirror attached to a magnet;
the magnet being adapted to socialite about an axis that is aligned substantially with a central axis of the magnet;
the magnet being moveably attached to a fixed support with springs;
the magnet having cavities formed therein;
the axis of oscillation of the magnet passes through the cavities; and
the springs which attach the magnet to the fixed support being positioned substantially within the cavities.

16. A beam scanning galvanometer comprising:
a mirror member adapted to oscillate about an axis;
the mirror member being moveably attached to a fixed position of the beam scanning galvanometer with springs;
the springs being adapted to produce torque on the mirror member when it is oscillated;
the mirror member and the springs having a natural frequency of oscillation;
a coil surrounding the mirror member;
the coil being adapted to generate a magnetic field that produces torque in the mirror member; and
the torque producible by the coil being high enough to cause rotational movement of the mirror member about the axis of oscillation at a speed higher than that which would result from the mirror member oscillating at its natural frequency.

17. A beam scanning galvanometer comprising:
an oscillating mirror member;
the mirror member being adapted to oscillate about an axis that is aligned substantially with a central axis of the member;
the mirror member being movably attached to a fixed portion of the beam scanning galvanometer with springs;
the mirror member having cavities formed therein;
the axis of oscillation of the mirror member passes through the cavities; and
the springs being positioned within the cavities.

* * * * *

UNITED STATES PATENT AND TRADEMARK OFFICE
CERTIFICATE OF CORRECTION

PATENT NO. : 5,280,377

DATED : January 18, 1994

INVENTOR(S) : Jasper S. Chadler, David M. Orlicki and John M. Kresock

It is certified that error appears in the above-indentified patent and that said Letters Patent is hereby corrected as shown below:

Col. 21, line 12, change "0.025 inches" to -- 0.250 inches --

Col. 22, line 12, change "socialite" to -- oscillate --

Signed and Sealed this

Thirty-first Day of May, 1994

Attest:

BRUCE LEHMAN

*Attesting Officer*          *Commissioner of Patents and Trademarks*